(12) United States Patent
Piesinger

(10) Patent No.: US 7,154,281 B2
(45) Date of Patent: Dec. 26, 2006

(54) APPARATUS AND METHOD FOR DETERMINING THE STATUS OF AN ELECTRIC POWER CABLE

(76) Inventor: Gregory H. Piesinger, 6225 E. Saguaro Vista Ct., Cave Creek, AZ (US) 85331

( * ) Notice: Subject to any disclaimer, the term of this patent is extended or adjusted under 35 U.S.C. 154(b) by 0 days.

(21) Appl. No.: 11/092,071

(22) Filed: Mar. 29, 2005

(65) Prior Publication Data

US 2005/0174126 A1   Aug. 11, 2005

Related U.S. Application Data

(63) Continuation-in-part of application No. 10/778,288, filed on Feb. 11, 2004, now abandoned.

(60) Provisional application No. 60/559,314, filed on Apr. 2, 2004.

(51) Int. Cl.
*G01R 31/02* (2006.01)

(52) U.S. Cl. ..................... 324/539; 324/72.5
(58) Field of Classification Search ............ 324/72.5, 324/543, 539, 149, 511, 537, 544
See application file for complete search history.

(56) References Cited

U.S. PATENT DOCUMENTS

| | | | |
|---|---|---|---|
| 3,826,981 A * | 7/1974 | Ross .................... | 324/72.5 |
| 4,760,327 A | 7/1988 | Walsh et al. | |
| 5,101,161 A * | 3/1992 | Walsh et al. ............ | 324/543 |
| 5,867,019 A * | 2/1999 | Malenko et al. ........ | 324/72.5 |
| 6,531,880 B1 | 3/2003 | Schneider et al. | |
| 6,737,871 B1 * | 5/2004 | Schneider et al. ...... | 324/539 |

OTHER PUBLICATIONS

Densley, "Influence of Environmental Contaminants on Performance of Shielded Power Cable" Ontario Power Technologies.
Boggs, "Failure Mechanisms of Shielded Power Cable Related to High Ground Shield Resistance and/or Insulation of Neutral Wires from Ground Shield", IEEE Trans. PD.
Boggs "500 Ohm-m—Low Enough Resistivity for a Cable Ground Shield Semison?" IEEE Electrical Insulation Magazine, vol. 17, No. 4, Jul./Aug. 2001.
"Mamco 'Hot Horn' Model 3000 Energized Cable Detector" http://www.lehmanscientific.com/p_memco.html, Dec. 24, 2003.
"Energized Cable Sensor" Hubbell Power Systems, Inc. Hubbell/Chance—Centralia, Missouri, Jun. 2002.

* cited by examiner

*Primary Examiner*—Anjan Deb

(57) ABSTRACT

An apparatus (100) and method (300) for determining the status of a electric cable (20) is provided. The apparatus (100) rigidly includes a probe (104) having coaxial contacts (150, 152) and including a melt unit (102) configured to melt an insulating jacket (32) of the cable (20), an instrumentation unit (106) coupled to the probe (104) and housing a cable analysis circuit (186), a status display unit (188) coupled to the instrumentation unit (106), an insulated shank (108) coupled to the instrumentation unit (106), and a hotstick adapter (110) coupled to the insulated shank (108). The cable analysis circuit (186) includes a connection determination circuit (200) configured to determine if an electrical connection between the probe (104) and the cable (20) is a valid connection, and a status determination circuit (222) configured to determine the status of the cable (20) while the electrical connection is a valid connection. The status display unit (188) includes a plurality of visual indicators (236) configured to impart connection condition and cable status to the user.

19 Claims, 12 Drawing Sheets

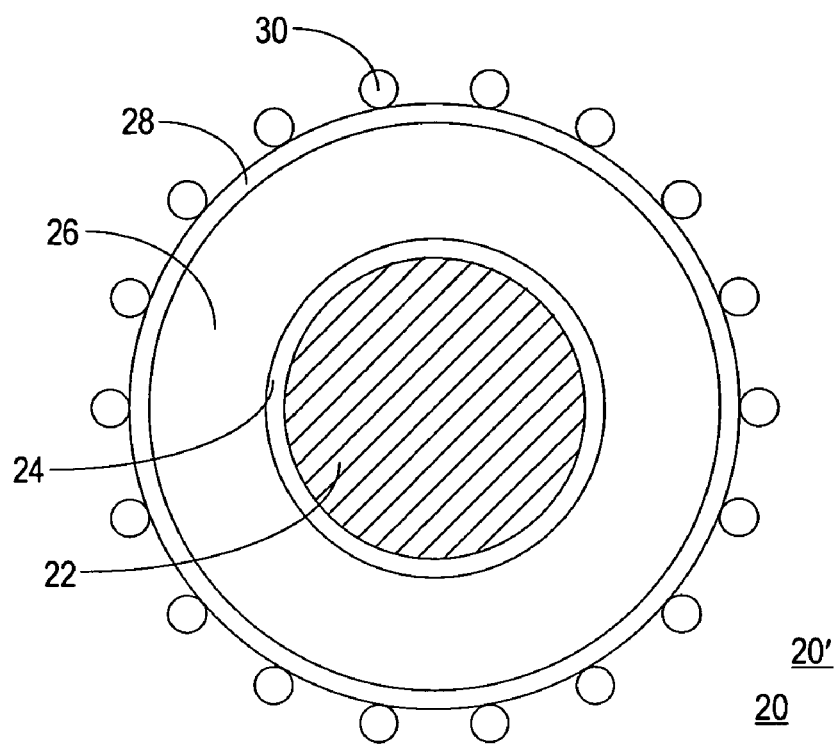
PRIOR ART    FIG. 1
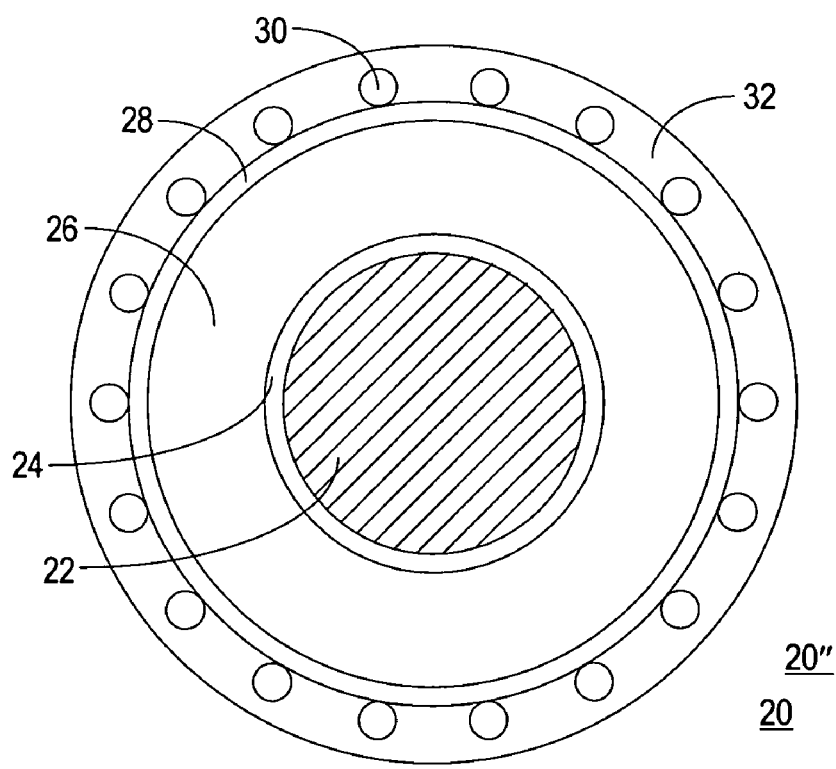
PRIOR ART    FIG. 2

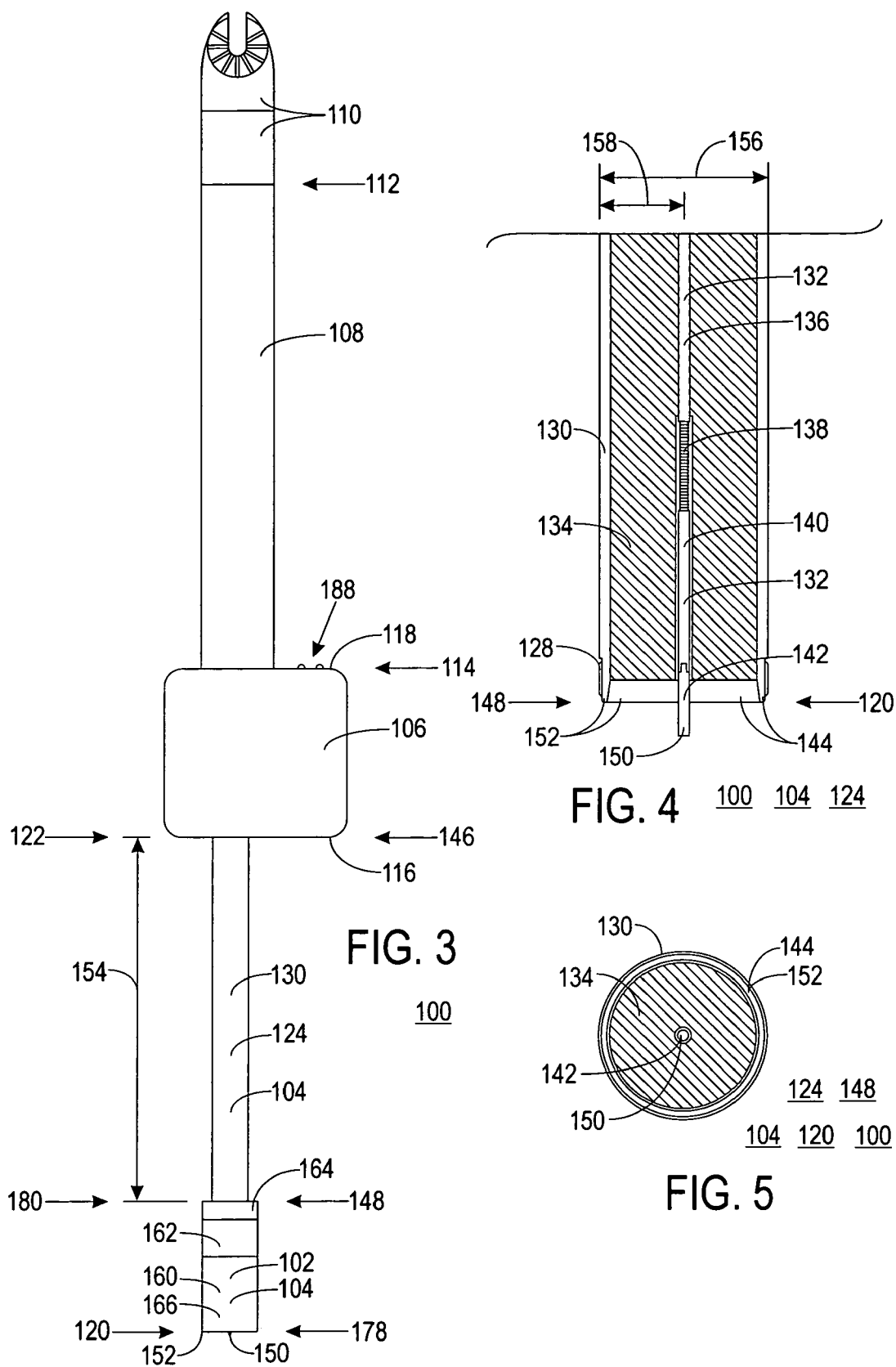

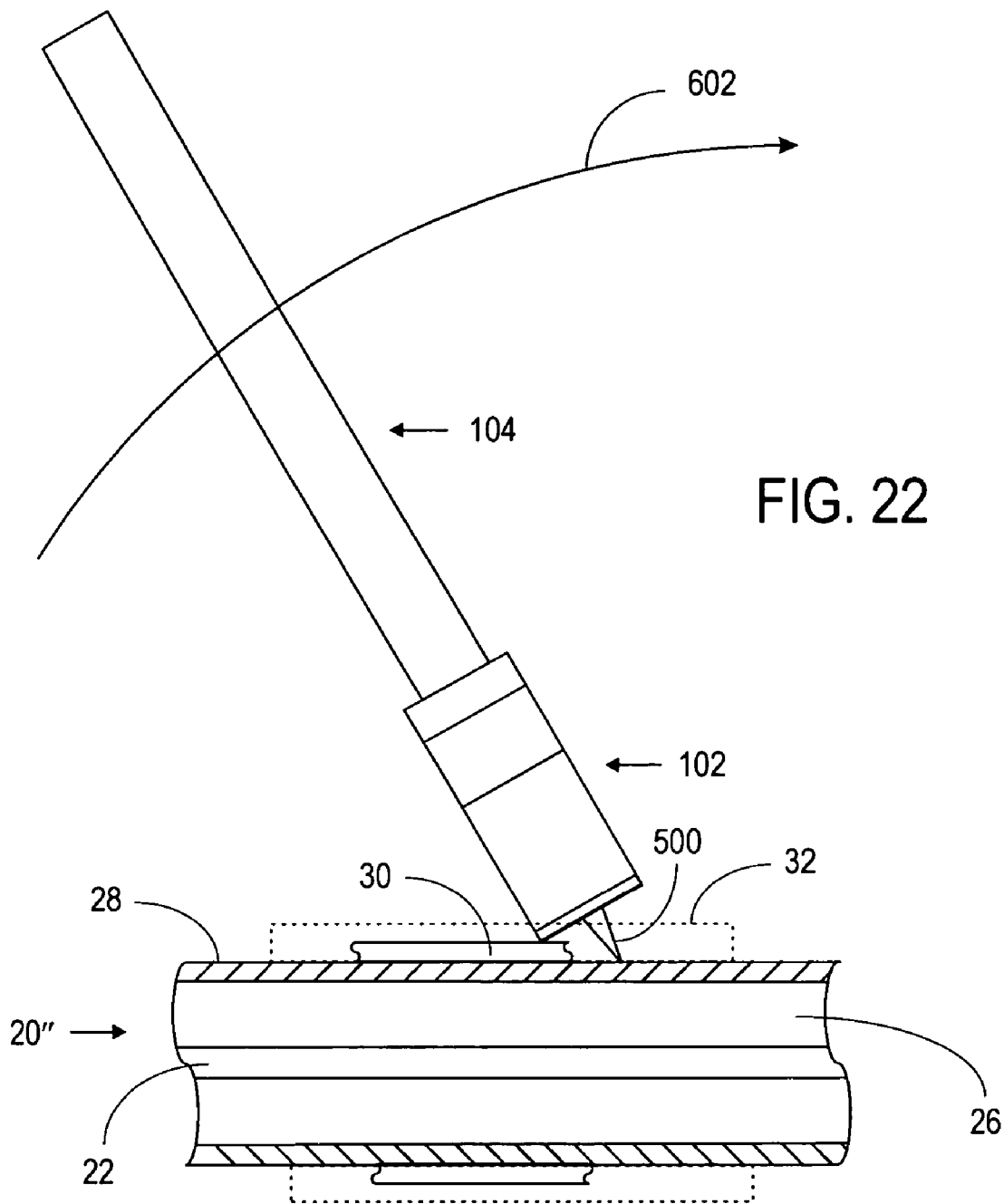

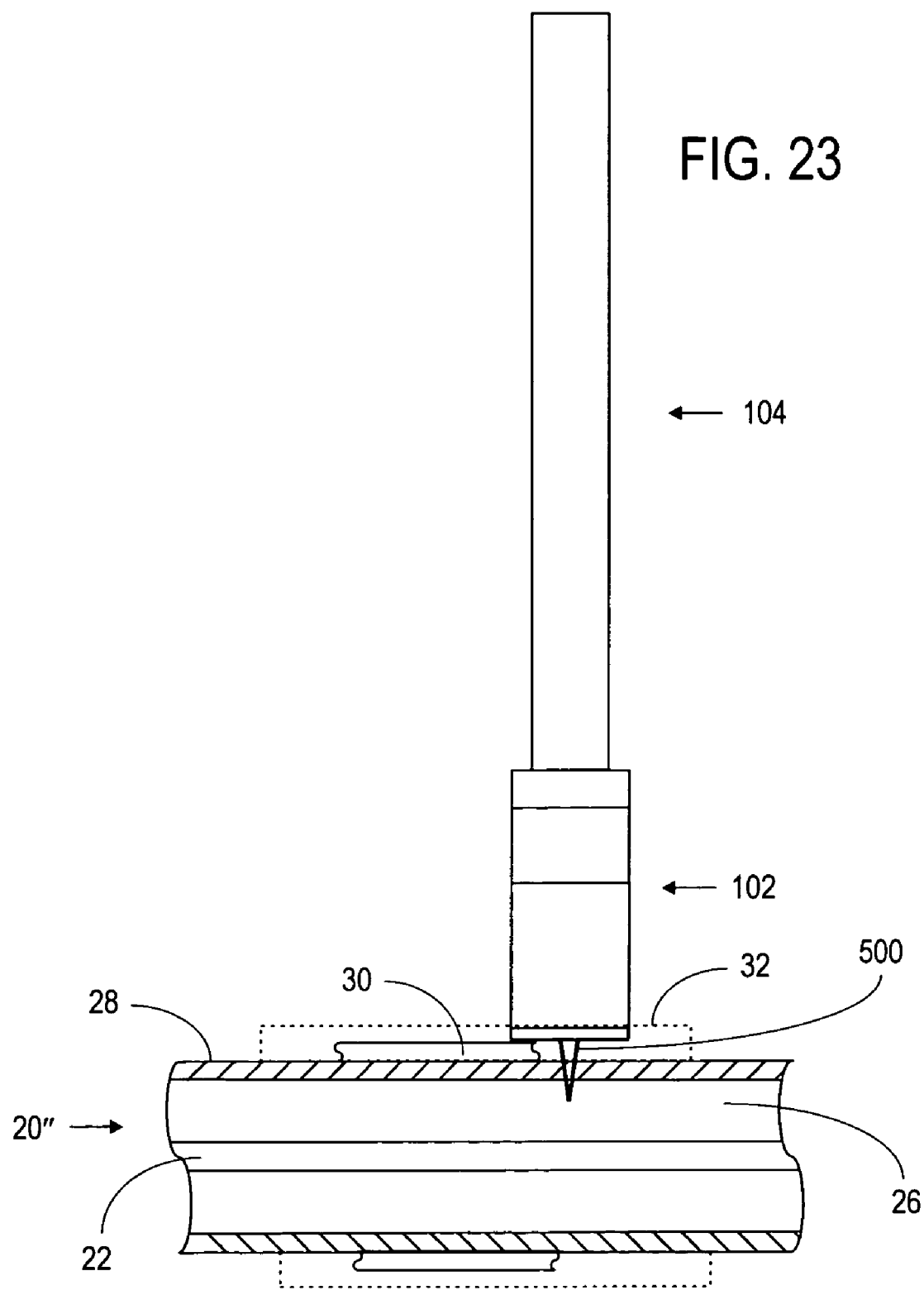

APPARATUS AND METHOD FOR DETERMINING THE STATUS OF AN ELECTRIC POWER CABLE

RELATED INVENTION

This application is a continuation-in-part (CIP) of application Ser. No. 10/778,288 filed on Feb. 11, 2004, now abandoned which is hereby incorporated by reference.

The present invention claims benefit under 35 U.S.C. §119(e) to "Apparatus and Method for Probing The Center Conductor Electric Field of Jacketed and Unjacketed Underground Distribution Cable," U.S. Provisional Patent Application Ser. No. 60/559,314 filed 2 Apr. 2004, which is incorporated by reference herein.

TECHNICAL FIELD OF THE INVENTION

The present invention relates to the field of electric power distribution networks. More specifically, the present invention relates to determining the status of underground residential distribution power cables.

BACKGROUND OF THE INVENTION

Electric power distribution networks are used by the electric utilities to deliver electricity from generating plants to customers. Although the actual distribution voltages will vary from utility to utility, in a typical network, three-phase power at high voltage (345,000 volts phase-to-phase) is delivered to multiple transmission substations at which transformers step this high voltage down to a lower three-phase voltage (69,000 volts phase-to-phase). This 69,000-volt three-phase power then feeds multiple distribution substations whose transformers further step down the voltage to the distribution voltage (12,470 volts phase-to-phase) and separate the power into three single-phase feeder cables. Typically, these feeder cables operate at 7,200 volts phase-to-ground. Each of these feeder cables branch into multiple circuits to power a plurality of local pole-mounted or pad-mounted transformers which step the voltage down to a final voltage of 120/240 volts for delivery to commercial and residential customers.

In many cases, the final 7,200-volt distribution network utilizes underground (i.e., buried) cables. These cables are typically known as underground residential distribution (URD) cables. Typical URD cables are shown in FIGS. 1 and 2.

In a typical URD cable 20, a central conductor 22 is surrounded by an inner semiconductor sheath 24. Inner semiconductor sheath 24 serves to relieve electrical stress by spreading out and making the electrical field more uniform.

Inner semiconductor sheath 24 is surrounded by an insulator 26. Insulator 26 has significant high-voltage insulating properties to minimize the overall size of URD cable 20. Typically, insulator 26 is formed of a polymeric material, such as polyethylene.

Surrounding insulator 26 is an outer semiconductor sheath 28. Like inner sheath 24, outer sheath 28 serves to relieve electrical stress by making the electrical field more uniform. Making the electrical field more uniform protects insulator 26, which would otherwise be more likely to break down.

Outer semiconductor sheath 28 is surrounded by a shield formed of a plurality of neutral conductors 30. Neutral conductors 30 together serve as a return line for central conductor 22. In a typical three-phase system, neutral conductors 30 carry current resulting from any imbalance among the three phases. In a mechanical sense, neutral conductors 30 form a barrier to protect URD cable 20 from casual penetration (as with a blunt shovel). In the event of a catastrophic penetration through neutral conductors 30 and into or through central conductor 22, neutral conductors 30 serve to provide a short electrical path and thereby offer some protection to a worker wielding the penetrating object.

Semiconductor layers 24 and 28 prevent high stress electrical field lines from forming under each neutral conductor 30. But as a side effect, semiconductor layers 24 and 28 also impede detection of the electrical field from outside of layer 28.

URD cable 20 may be an unjacketed URD cable 20' (FIG. 1). In unjacketed URD cable 20', neutral conductors 30 form the outermost layer of the cable. Neutral conductors 30 are therefore in contact with the Earth when unjacketed URD cable 20' is buried.

URD cable 20 may also be a jacketed URD cable 20". In jacketed URD cable 20", neutral conductors 30 are surrounded by and embedded within an insulating jacket 32. Whether URD cable 20 is jacketed or unjacketed, neutral conductors 30 need not be grounded, but usually are grounded at the ends.

As new customers are added, URD cable 20 is cut and an extension cable is spliced in to supply power to the new customer's transformer. This poses certain problems.

One problem is that there are often multiple URD cables 20 in a given trench, conduit, or raceway. Typically, one of these URD cables 20 is de-activated prior to splicing. A problem exists in determining which of these multiple URD cables 20 is de-energized (i.e., "dead").

Clamp-on ammeters are occasionally used in an attempt to determine if a URD cable 20 is dead. Since each URD cable 20 carries its own return, the ammeter is used to measure differential current. But a reading of zero current may result from two very different conditions. Either the cable is in-fact a dead cable, or the cable is live but nearly perfectly balanced. Since one of the goals of electrical distribution is to achieve perfect balance, the value of the test becomes more meaningless as this goal is more closely achieved. Consequently, many live cables are misdiagnosed as being dead.

Another related problem is that, in a given dig, extraneous unmapped URD cables 20 may be present. These extraneous URD cables 20 may or may not be energized, and will often confuse ammeter measurements to the point where it is impossible to determine which of the URD cables 20 is the de-energized URD cable 20 to be cut and spliced.

When a URD cable 20 is to be cut and spliced, it is first spiked. That is, a "spike" is driven through the selected URD cable 20 to short neutral conductors 30 to center conductor 22. If the spiked URD cable 20 is live, then spiking will create a short circuit and trip the appropriate circuit breakers. This assures that the worker will not cut into a live URD cable 20.

The spiking of a live URD cable 20 is undesirable for several reasons. First, spiking a live URD cable 20 poses a risk to the worker, albeit a risk significantly less than the cutting of a live URD cable 20. Second, tripping the circuit breaker causes an unnecessary power outage to all customers served by that URD cable 20. Third, unnecessarily spiking a URD cable 20 necessitates a repair of that URD cable 20. Spiking a live URD cable 20, therefore, is dangerous, costly, and time consuming.

Various apparatus have been developed to identify the status, live or dead, of URD cables 20. All of these apparatuses suffer from one or more deficiencies. When attempting to use such apparatuses to identify the status of a given URD cable 20, there are four primary conditions:

True-dead—identifying a given URD cable 20 as dead when it is in fact dead;

False-dead—identifying a given URD cable 20 as dead when it is in fact live;

True-live—identifying a given URD cable 20 as live when it is in fact live; and

False-live—identifying a given URD cable 20 as live when it is in fact dead.

A false-live result may cause the worker to backtrack and double-check the removal of power from the desired URD cable 20, may cause additional and unnecessary excavation, and may cause further labor and paperwork. This may result in a waste of time and resources. But a false-dead result, on the other hand, may lead to misidentification of the specific URD cable 20 to be cut and spliced. This is the worst possible scenario, in that the worker would then spike a live URD cable 20, believing it to be dead. As previously mentioned, spiking a live URD cable 20 is dangerous, costly, and time-consuming.

The only good status results are then a true-live and a true-false. Only such results will properly identify the specific URD cable 20 to be spiked, cut, and spliced, thereby safely, inexpensively, and efficiently allowing the work to proceed.

Apparatuses intended to determine status almost invariably test to determine if a URD cable 20 is live. No active test is performed to determine if URD cable 20 is dead. The presumption is, of course, that if URD cable 20 is not live, it is dead. This is a dangerous presumption.

If such an apparatus determines a URD cable 20 is live, it is often correct. That is, such an apparatus produces a reasonably reliable true-live result, with few false-live results. On the other hand, such an apparatus does not positively determine if URD cable 20 is dead. The apparatus can therefore only determine if URD cable 20 is "not-live". URD cable 20 may test not-live if it is dead, or if it is live and the test fails for whatever reason, including worker error. This form of test therefore exhibits a high incidence of false-dead results. This is the worst possible scenario, in that the worker would then spike a live URD cable 20, believing it to be dead.

Another problem with many apparatuses for determining the status of URD cables 20 is that they are cumbersome to use. Often, an apparatus (or a portion of the apparatus) must be clamped to the URD cable 20 under test. This requires the worker to get down into a trench or otherwise obtain direct access to and manipulate URD cable 20.

Many such apparatuses are usable only with unjacketed URD cables 20'. Unjacketed URD cables 20 suffer from corrosion and other factors that shorten their useful lifetimes. For this reason, the cable of choice for newer installations is almost invariably jacketed URD cable 20". In order to use an apparatus designed for unjacketed URD cable 20' with a jacketed URD cable 20", a portion of the insulating jacket 32 must be cut away, drilled, or otherwise penetrated. This, too, requires that the worker obtains direct access to and manipulates URD cable 20.

Because the URD cables 20 may carry high voltage (typically 7,200 volts), any procedure requiring direct manipulation of the cable is inherently dangerous. A faulty or misidentified cable may expose the worker to high voltage, and potentially precipitate injury or death. Additionally, all procedures requiring direct manipulation of the cable are cumbersome, costly, and time-consuming. This is especially true for a jacketed URD cable 20" being tested with an apparatus intended for an unjacketed URD cable 20". When a portion of the insulating jacket 32 has been cut away and that URD cable 20 is determined to not be the URD cable 20 to be cut and spliced, then that URD cable 20 must then be repaired to protect it from corrosion and other factors that would otherwise shorten its useful lifetime. This repair is itself cumbersome, costly, and time-consuming.

Cumbersome and time-consuming procedures often inspire workers to shortcut the testing procedure. This may lead to injury or death, as well as expensive and time-consuming error.

Even those apparatuses which do not require the worker to enter the trench often require the worker to insert the apparatus into the trench to make a measurement, then remove the apparatus from the trench to obtain the results. Such apparatuses are often difficult to maneuver from a distance. For example, one such apparatus has two probes more than 3 cm apart, and is configured to be attached to a hotstick. In order to establish a proper connection, the apparatus must be positioned so that the two probes are oriented longitudinally with the URD cable 20 and the hotstick and apparatus are perpendicular to the URD cable. This requires careful manipulation on the part of the worker. Such careful manipulation is awkward and cumbersome to perform in the field, and inspires the worker to shortcut the testing procedure by making a minimum number of tests (often a single test, especially where a desired result is obtained) where a plurality of tests is required for positive results.

Many apparatuses for determining the status of a URD cable 20 do so by detecting the presence of an electric field in or around a live URD cable 20. This field is very weak, on the order of a few millivolts at best. Since the URD cables carry high voltages at respectable currents, the environment in which the tests are performed is generally electrically noisy. The combination of low signal strength and a noisy environment creates a tendency for such apparatuses to indicate false-live statuses. This is especially true of those apparatuses having lengthy and or unshielded input lines. Of course, an apparatus may be designed to obtain fewer false-live readings at the expense of more false-dead readings. But this would only lead to a less usable apparatus. Since the false-dead condition is even worse than the false-live condition.

Many apparatuses have a first portion contacting the URD cable 20 under test and a second portion indicating the test results, where the first portion is naturally in the trench or raceway with the URD cable 20 and the second portion is with the operator. Alternatively, many apparatuses derive power from a generator or work vehicle. In both cases, there is a cable or line extending from the URD cable to a person or object outside of the trench or raceway. This poses a significant hazard in that a defective URD cable 20, or a penetration of an otherwise good URD cable 20, may cause the high voltage to be conducted over the line to a point outside the trench or raceway. Once high voltage is out of the trench or raceway, there is a danger that an individual may come into contact with the high voltage and suffer injury or death as a result. In addition, this high voltage may find a path through equipment which may subsequently become damaged or destroyed.

SUMMARY OF THE INVENTION

Accordingly, it is an advantage of the present invention that an apparatus is provided for determining the status of an underground residential distribution (URD) cable.

It is another advantage of the present invention that an apparatus is provided that actively tests a URD cable for both a live and a dead status.

It is another advantage of the present invention that an apparatus is provided that determines the status of a URD cable while the worker is safely at a distance from the URD cable.

It is another advantage of the present invention that an apparatus is provided that displays results viewable at a distance.

It is another advantage of the present invention that an apparatus is provided that determines a quality of connection to a URD cable while determining the status thereof.

It is another advantage of the present invention that an apparatus is provided that determines the status of a URD cable in an easy and straightforward manner.

The above and other advantages of the present invention are carried out in one form by an apparatus for determining the status of a URD cable in an electric power network operating at a line frequency. The apparatus includes a rigid probe with a common contact configured to contact a neutral conductor of the URD cable, and an input contact insulated from the common contact and configured to contact an outer semiconductor sheath of the URD cable or to penetrate through it. The apparatus also includes an instrumentation unit rigidly coupled to the probe, a cable analysis circuit housed within the instrumentation unit and electrically coupled to the common and input contacts, and a status display unit electrically coupled to the cable analysis circuit.

The above and other advantages of the present invention are carried out in another form by an apparatus for determining the status of a URD cable in an electric power network. The apparatus includes a probe configured to establish an electrical connection with the URD cable, wherein the electrical connection consists of a common contact of the probe in contact with a neutral conductor of the URD cable, and an input contact of the probe in direct contact with an outer semiconductor sheath of the URD cable or in capacitive contact with the central conductor. The apparatus also includes a cable analysis circuit coupled to the probe. This circuit simultaneously determines if the electrical connection is a valid connection while determining the status of the URD cable. A status display unit is coupled to the cable analysis circuit and configured to indicate the status of the URD cable when the electrical connection is a valid connection.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 1 shows a cross-sectional view of a typical prior-art unjacketed underground residential distribution (URD) cable;

FIG. 2 shows a cross-sectional view of a typical prior-art jacketed URD cable;

FIG. 3 shows a side view of a power-cable status determination apparatus in accordance with a preferred embodiment of the present invention;

FIG. 4 shows a cross-sectional side view of a portion of the apparatus of FIG. 3 for use with an unjacketed URD cable in accordance with a preferred embodiment of the present invention;

FIG. 5 shows an end view of the apparatus portion of FIG. 4 in accordance with a preferred embodiment of the present invention;

FIG. 22 shows a side view of a portion of the power-cable status determination apparatus of FIG. 3 as it is initially applied to a URD cable in accordance with a preferred embodiment of the present invention; and FIG. 23 shows a side view of a portion of the power-cable status determination apparatus of FIG. 3 as it is fully applied to a URD cable in accordance with a preferred embodiment of the present invention.

DETAILED DESCRIPTION OF THE PREFERRED EMBODIMENTS

Figure 6:
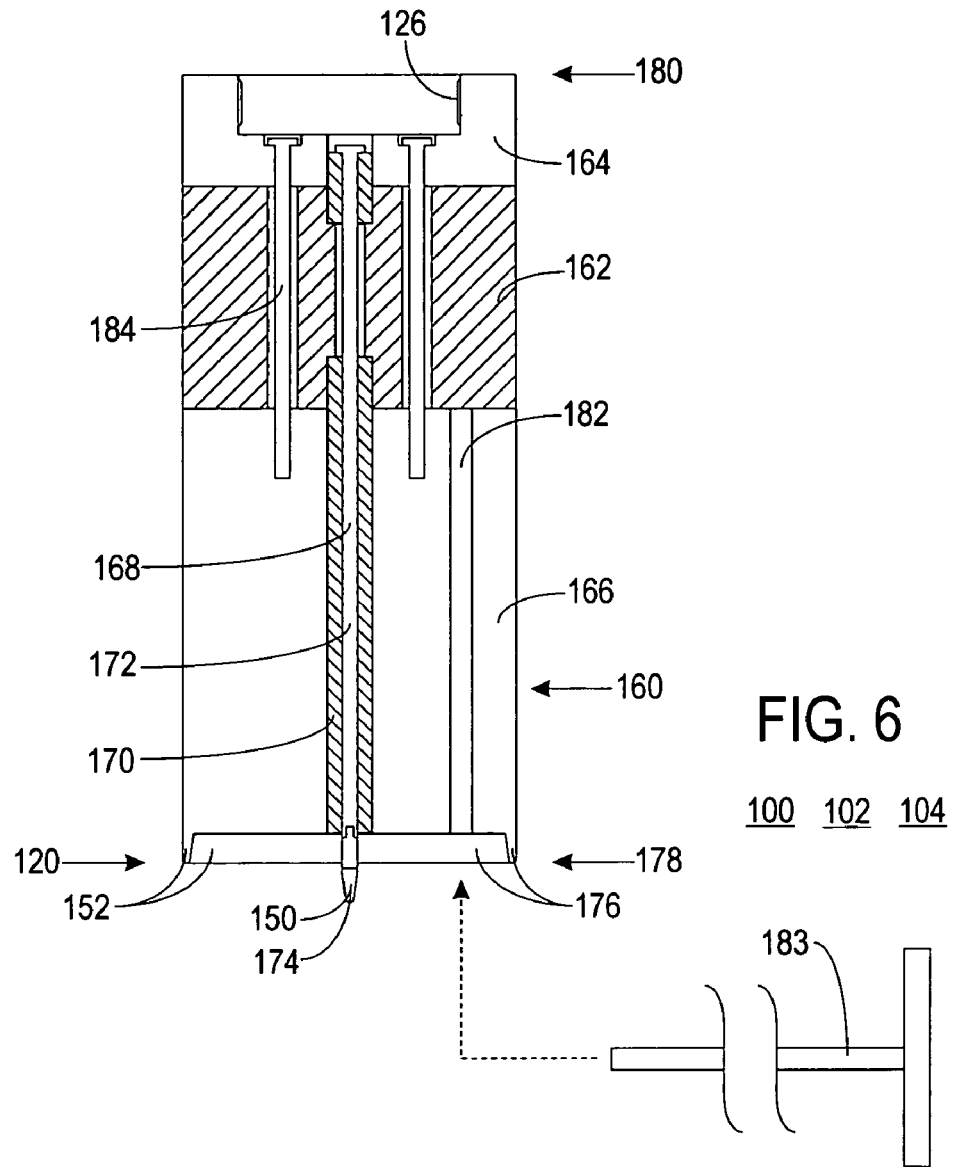
FIG. 6 shows a cross-sectional side view of a melt unit for the apparatus of FIGS. 3 and 4 for use with a jacketed URD cable in accordance with a preferred embodiment of the present invention.
Figure 7:
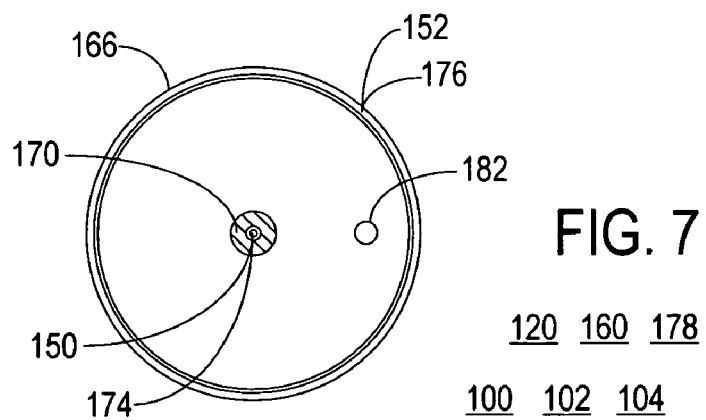
FIG. 7 shows an end view of the melt unit of FIG. 6 in accordance with a preferred embodiment of the present invention.

FIGS. 1 and 2 show cross-sectional views of typical underground residential distribution (URD) cables 20, with FIG. 1 showing an unjacketed URD cable 20' and FIG. 2 a jacketed URD cable 20". FIG. 3 shows a side view of an apparatus 100 that determines the status of a URD cable 20 in accordance with a preferred embodiment of the present invention. FIG. 4 shows a cross-sectional side view and FIG. 5 an end view of a portion of apparatus 100 for use with unjacketed URD cable 20' in accordance with a preferred embodiment of the present invention. FIG. 6 shows a side view and FIG. 7 an end view of a melt unit 102 for apparatus 100 for use with jacketed URD cable 20" in accordance with a preferred embodiment of the present invention. The following discussion refers to FIGS. 1 through 7.

Status determination apparatus 100 is a probing device configured to engage URD cable 20 and determine the status thereof. Apparatus 100 is a rigid structure made up of a probe 104 to which is coupled an instrumentation unit 106, to which is coupled an insulated shank 108, to which is coupled a hotstick adapter 110. By being rigid, apparatus 100 allows the worker to couple apparatus 100 to a hotstick and use the apparatus as an extension of the hotstick to contact URD cable 20 from a distance. This allows the user to determine the status of URD cable 20 without necessitating direct manipulation of URD cable 20 by the worker. This significantly increases ease of use and overall safety.

Hotstick adapter 110 is a standardized hotstick adapter 110 used in the industry to couple to a hotstick (not shown), which is an insulated extension pole. The use of a hotstick allows apparatus 100 to be used at a distance from the worker, as in the bottom of a deep trench. This allows the worker to determine the status of a URD cable 20 safely and conveniently from outside the trench.

Insulated shank 108 has an adapter end 112 and an instrumentation end 114 opposing adapter end 112. Hotstick adapter 110 is rigidly coupled to adapter end 112 of insulated shank 108. When apparatus 100 is used with a hotstick, the hotstick is coupled to hotstick adapter 110, and insulated shank 108 serves as an extension of the hotstick. When apparatus 100 is used without a hotstick (as when URD cable 20 is at the surface or in a raceway), then insulated shank 108 serves as a short hotstick to provide ease of use while maintaining safety for the worker.

Instrumentation unit 106 has a probe side 116 and a display side 118 opposing probe side 116. Instrumentation end 114 of insulated adapter 108 is rigidly coupled to display side 118 of instrumentation unit 106.

Probe 104 has an active end 120 and an instrumentation end 122 in opposition to active end 120. Instrumentation end 122 is rigidly coupled to probe side 116 of instrumentation unit 106. Together, probe 104, instrumentation unit 106, insulated shank 108, and hotstick adapter 110 form a rigid structure for apparatus 100.

The methodologies used to couple probe 104 to instrumentation unit 106, instrumentation unit 106 to insulated shank 108, and insulated shank 108 to hotstick adapter 110 are commonplace in the industry and well known to those of ordinary skill in the art. These methodologies are therefore not discussed herein.

Probe 104 is made up of melt unit 102 and a probe body 124. In the preferred embodiment, melt unit 102 is detachably and rigidly coupled to probe body 124 by female and male threads 126 and 128, respectively. This allows melt unit 102 to be removed from probe body 124 when probe 104 is to be used with unjacketed URD cable 20', and allows melt unit 102 to be coupled to probe body 124 when probe 104 is to be used with jacketed URD cable 20".

When melt unit 102 is removed from probe body 124, melt unit 102 is typically still hot. An effective way of removing melt unit 102 without risk of injury is to slip a pocket-like hot pad (not shown) over melt unit 102. The hot pad may then be used to unscrew and remove melt unit 102 from probe body 124. Melt unit 102 may then be stored within the hot pad until cool. A typical pocket-like hot pad for this use is the type universally sold for use over the handle of a cast-iron skillet. Any similar pocket-type hot pad will also work.

Those skilled in the art will appreciate that it is not a requirement of the present invention that melt unit 102 be detachable from probe body 124. In an alternative embodiment, apparatus 100 may be produced for use with unjacketed URD cable 20' only. In this embodiment, probe 104 would lack melt unit 102 completely. In another alternative embodiment, apparatus 100 may be produced for use with jacketed URD cable 20" only. In this embodiment, probe 104 might have melt unit 102 fixedly and rigidly coupled to probe body 124. The differences in the internal construction of probe 104 (discussed hereinafter) to effect these alternative embodiments would be obvious to one of ordinary skill in the art and are not discussed herein.

When apparatus 100 is used with unjacketed URD cable 20', melt unit 102 is desirably omitted and probe 104 is made up solely of probe-body 124. Probe body 124 is made up of a cylindrical outer shell 130 and a central input conductor 132. Cylindrical outer shell 130 is electrically conductive, but desirably somewhat resistive to thermal conduction. A typical material for outer shell 130 is stainless steel.

An insulator 134 separates shell 130 and input conductor 132. Desirably, outer shell 130, insulator 134, and input conductor 132 are all coaxial. By being coaxial, probe body 124 rejects extraneous noise during determination of the status of URD cable 20 (discussed in greater detail hereinafter). By being coaxial, probe body 124 more easily establishes an electrical connection with URD cable 20 than apparatuses having multiple non-coaxial probes (discussed in more detail hereinafter).

Input conductor 132 is made up of a conductive spring 138, a movable conductor portion 140, and an input contact 142. In the embodiment depicted in FIG. 4, a fixed conductor portion 136 is fixedly coupled within insulator 134. Movable conductor portion 140 is movably coupled within insulator 134. Conductive spring 138 electrically couples fixed and movable conductor portions 136 and 140. Input contact 142 is coupled to movable conductor portion 140. In another embodiment (not shown), movable conductor 140 is a solid rod that extends entirely through probe body 124. A flexible wire connects movable conductor 140 to an electrical circuit, and spring 138 is located inside instrument housing 106. Spring 138 then pushes against conductor portion 140 but is substantially electrically isolated from the electronic signal conveyed by conductor portion 140. Both embodiments allow input contact 142 to be spring loaded, but this is not a requirement of the present invention.

In one alternate embodiment, input contact 142 may be detachably coupled to movable conductor portion 140. This allows input contact 142 to be changed if worn or damaged, but is not a requirement of the present invention. Those skilled in the art will appreciate that input contact 142 may also be integral to movable conductor portion 140 without departing from the spirit of the present invention.

Outer shell 130 of probe body 124 incorporates a circular common contact 144 and male threads 128. Male threads 128 allow probe body 124 to couple to melt unit 102 as required.

Probe body 124 has an instrumentation end 146 and an active end 148. When apparatus 100 is used to determine the status of unjacketed URD cable 20', then melt unit 102 is desirably omitted. Probe-body instrumentation end 146 then serves as probe instrumentation end 122, and probe-body active end 148 serves as probe active end 120. Probe-body input and common contacts 142 and 144 then serve as probe input and common contacts 150 and 152, respectively, and are located at probe active end 120.

Probe body 124 has a length 154 of not more than 32.0 cm, and desirably has a length 154 of approximately 16.5 cm. In use, apparatus 100 is typically attached to a hotstick (not shown) and placed into contact with a URD cable 20 located in the bottom of a trench while the worker remains safely outside the trench. For use with unjacketed URD cable 20', probe 104 desirably consists of probe body 124, with instrumentation unit 106 coupled to the instrumentation end 122 of probe 104. It is desirable, therefore, that probe body 124 be long enough to allow the worker to see active end 120 of probe 104 around instrumentation unit 106 as probe 104 makes contact with URD cable 20. Conversely, the longer probe body 124 is, the more susceptible apparatus 100 is to electrical noise (discussed hereinafter). A compromise is desirably reached between these two opposing requirements. A maximum length 154 of 32.0 cm, and a desirable length 154 of approximately 16.5 cm, for probe body 124 successfully effects that compromise in the preferred embodiment.

Additionally, probe body 124 has a diameter 156 of not more than 6.0 cm. This provides a distance 158 between input and common contacts 150 and 152 of not more than 3.0 cm. Desirably, probe body has a diameter 156 of approximately 1.6 cm, providing a nominal distance 158 between contacts 150 and 152 of 0.8 cm. By having a single probe 104 with two contacts 150 and 152 separated by less than 3.0 cm, an electrical connection between probe 104 and URD cable 20 is greatly facilitated over multi-probe apparatuses having a greater distance between contacts.

By having input contact 150 within and coaxial with common contact 152, a significant increase in the ease of establishing an electrical contact between probe 104 and URD cable 20 is realized. Apparatus 100 need only establish an electrical contact between common contact 152 and any single neutral conductor 30 of URD cable 20, and need only establish an electrical contact between input contact 150 and any point on outer semiconductor sheath 28 of URD cable 20. Common contact 152 is configured as a ring or lip at the active end of probe 104, and input contact 150 is configured as a pin coaxial with common contact 152. This two-point contact scheme allows probe 104 to successfully establish electrical contact with URD cable 20 while apparatus 100 is off-center and non-perpendicular to URD cable 20, i.e., while the worker holds the hotstick with apparatus 100 attached at any of a wide variety of angles and contacts URD cable 20 at any of a wide variety of on- and off-axis locations. This is in marked contrast to two-probe apparatuses that require a specific orientation to URD cable 20 to effect contact.

In addition, by having contacts 150 and 152 separated by less than 3.0 cm, a significant reduction in electrical noise (discussed hereinafter) may be realized by apparatus 100. This is especially true because, for probe body 124, input conductor 132 is coaxial with and shielded by outer shell 130.

Those skilled in the art will appreciate that probe-body 124 may be produced with dimensions other than those given herein without departing from the spirit of the present invention.

When apparatus 100 is to be used with jacketed URD cable 20", then melt unit 102 is coupled to probe body 124, and probe 104 is made up of probe-body 124 and melt unit 102. Melt unit 102 is made up of a thermal reservoir 160, a thermal insulator 162, and a coupling component 164. Coupling component 164 contains female threads 126 and serves to couple melt unit 102 to probe-body 124.

Thermal reservoir 160 is made up of a thermally massive, thermally and electrically conductive cylindrical outer shell 166 and a thermally and electrically conductive central input conductor 168. Outer shell 166 serves as the primary thermal component of thermal reservoir 160. For this reason, outer shell is desirably fabricated of a thermally retentive material, such as aluminum or aluminum alloys.

A thermally conductive electrical insulator 170 separates shell 166 and input conductor 168. Since outer shell 166 serves as the primary thermal component of thermal reservoir 160, insulator 170 is preferably small in cross section in order to maximize the mass of outer shell 166. Outer shell 166, insulator 170, and input conductor 168 are all mutually coaxial.

Input conductor 168 is made up of a fixed conductor portion 172 and an input contact 174. In the preferred embodiment, input contact 174 is detachably coupled to fixed conductor portion 172. This allows input contact 174 to be changed if a cable 20" with unusually large or small diameter neutral conductors 30 is encountered of if input contact 174 becomes worn or damaged. But this is not a requirement of the present invention. Those skilled in the art will appreciate that input contact 174 may be integral to fixed conductor portion 172 without departing from the spirit of the present invention.

Melt unit 102 has an active end 178 and a body end 180. Outer shell 166 of melt unit 102 incorporates a circular common contact 176 configured as a ring or lip at active end 178. The ring or lip projects outward only for a distance that is slightly greater than the distance between the outside surface of neutral conductors 30 and the outside of jacket 32 of cable 20", e.g., about 3.8 mm.

When melt unit 102 is used to establish electrical contact with jacketed URD cable 20", body end 180 is coupled to active end 148 of probe body 124. Probe-body instrumentation end 146 then serves as probe instrumentation end 122, and melt-unit active end 178 then serves as probe active end 120. Melt-unit input and common contacts 174 and 176 then serve as probe input and common contacts 150 and 152, respectively, and are located at probe active end 120. Input contact 174 desirably projects beyond common contact 176 by a distance roughly equal to or slightly greater than the diameter of a neutral conductor 30, e.g., about 2.5 mm.

Figure 10:
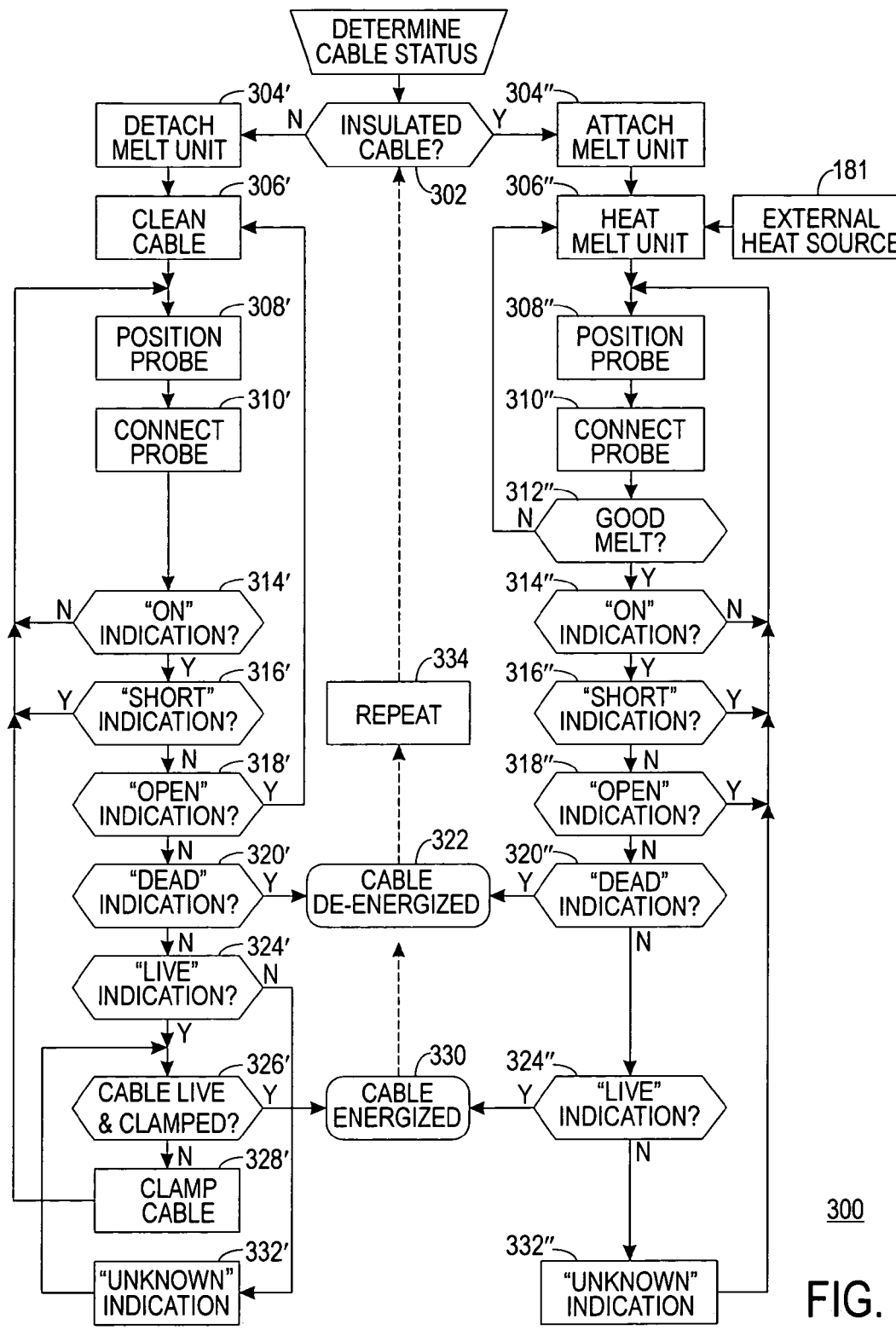
FIG. 10 shows a flow chart of a method for determining the status of a URD cable using the apparatus of FIG. 3 in accordance with a preferred embodiment of the present invention.

When preparing melt unit 102 to melt insulating jacket 32 of jacketed URD cable 20", thermal reservoir 160 is heated by applying heat from an external heat source 181 (FIG. 10). External heat source 181 is a source of heat external to apparatus 100. This allows apparatus 100 to be self-contained without having to provide sufficient power to heat melt unit 102. Typical external heat sources 181 may be a torch or a heating unit powered by line or vehicular current.

Thermal reservoir 160 is desirably heated to a temperature suitable for melting insulating jacket 32 of jacketed URD cable 20". This temperature is desirably around 200–250° C. To prevent overheating of thermal reservoir 160, a thermometer 183 (FIG. 6) may be used to measure an inside temperature of thermal reservoir 160. To facilitate this, a thermometer connector 182 is provided in thermal reservoir 160. Thermometer connector 182, in its simplest form, need only be a hole into the end of thermal reservoir 160 into which the sensing end of thermometer 183 is inserted during heating.

Thermal reservoir 160 desirably has sufficient mass to maintain a temperature suitable to melt insulating jacket 32 a plurality of times. In the preferred embodiment, thermal reservoir has sufficient mass to maintain a melting temperature for at least five normal status determinations.

Thermal insulator 162 provides a barrier between thermal reservoir 160 and coupling component 164. This impedes the heat from thermal reservoir from traveling up probe 104. Desirably, thermal insulator 162 is configured of a non-thermally conducting material, such as polytetrafluoroethylene (a.k.a. Teflon®) or lava rock.

Electrical continuity between probe body 124 and thermal reservoir 160 is provided through fixed conductor portion 172 and a conductive coupler 184. Melt-unit input contact 174 is electrically coupled to probe-body input contact 142 through fixed conductor portion 172. Melt-unit common contact 176 is electrically coupled to probe-body common contact 144 through thermal-reservoir outer shell 166, conductive couplers 184, and coupling component 164.

In the preferred embodiment, conductive couplers 184 are screws or pins. This is not a requirement of the present invention, however, and other means of electrical coupling may be effected without departing from the spirit of the present invention.

Mechanical connectivity between thermal reservoir 160, thermal insulator 162, and coupling component 164 is desirably established though the use of conductive couplers 184 in the form of small-diameter, stainless steel screws. Thus, couplers 184 provide mechanical and electrical coupling. In addition, since couplers 184 are small in diameter and made from stainless steel they also serve as thermal insulators. But the use of pins, adhesives (not shown) or other components or methodologies to couple thermal reservoir 160, thermal insulator 162, and coupling component 164 to form melt unit 102 does not depart from the spirit of the present invention.

Figure 8:
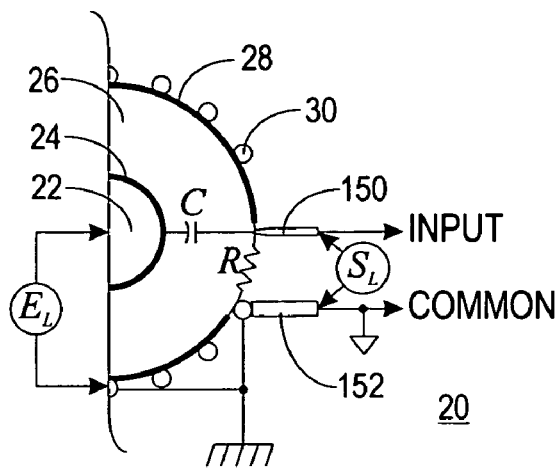
FIG. 8 shows a schematic view of the electrical characteristics of a URD cable in accordance with a preferred embodiment of the present invention.
Figure 9:
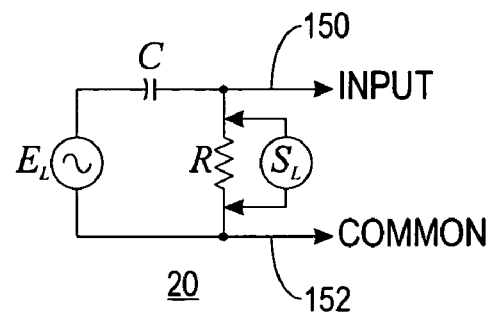
FIG. 9 shows a schematic view of an equivalent circuit of a URD cable in accordance with a preferred embodiment of the present invention.
Figure 14:
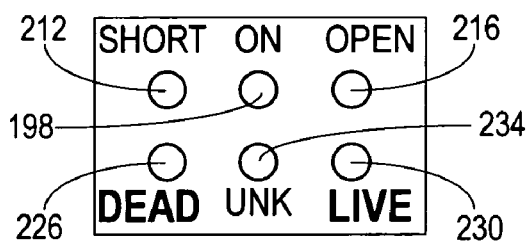
FIG. 14 shows a plan view of a status display panel for the apparatus of FIG. 3 depicting no electrical connection in accordance with a preferred embodiment of the present invention.

FIGS. 8 and 9 show schematic views of the electrical characteristics of URD cable 20 and an equivalent circuit of URD cable 20, respectively, in accordance with a preferred embodiment of the present invention. The following discussion refers to FIGS. 8 and 9.

URD cable 20 has a central conductor 22. When URD cable 20 is live, central conductor 22 carries current at a high voltage $E_L$ (typically 7,200 volts). This current is coupled through a cable capacitance C to outer semiconductor sheath 28. A portion of this current therefore passes through a cable resistance R to form a line signal $S_L$. Line signal $S_L$ has a line-signal amplitude that is normally either very small, on the order of a few millivolts (when URD cable 20 is live) or nearly zero (when URD cable 20 is dead). Naturally, line signal $S_L$ is at line frequency (normally 50–60 Hz). Line signal $S_L$ forms across cable resistance R. Line signal $S_L$ is therefore present at input contact 150.

Figure 11:
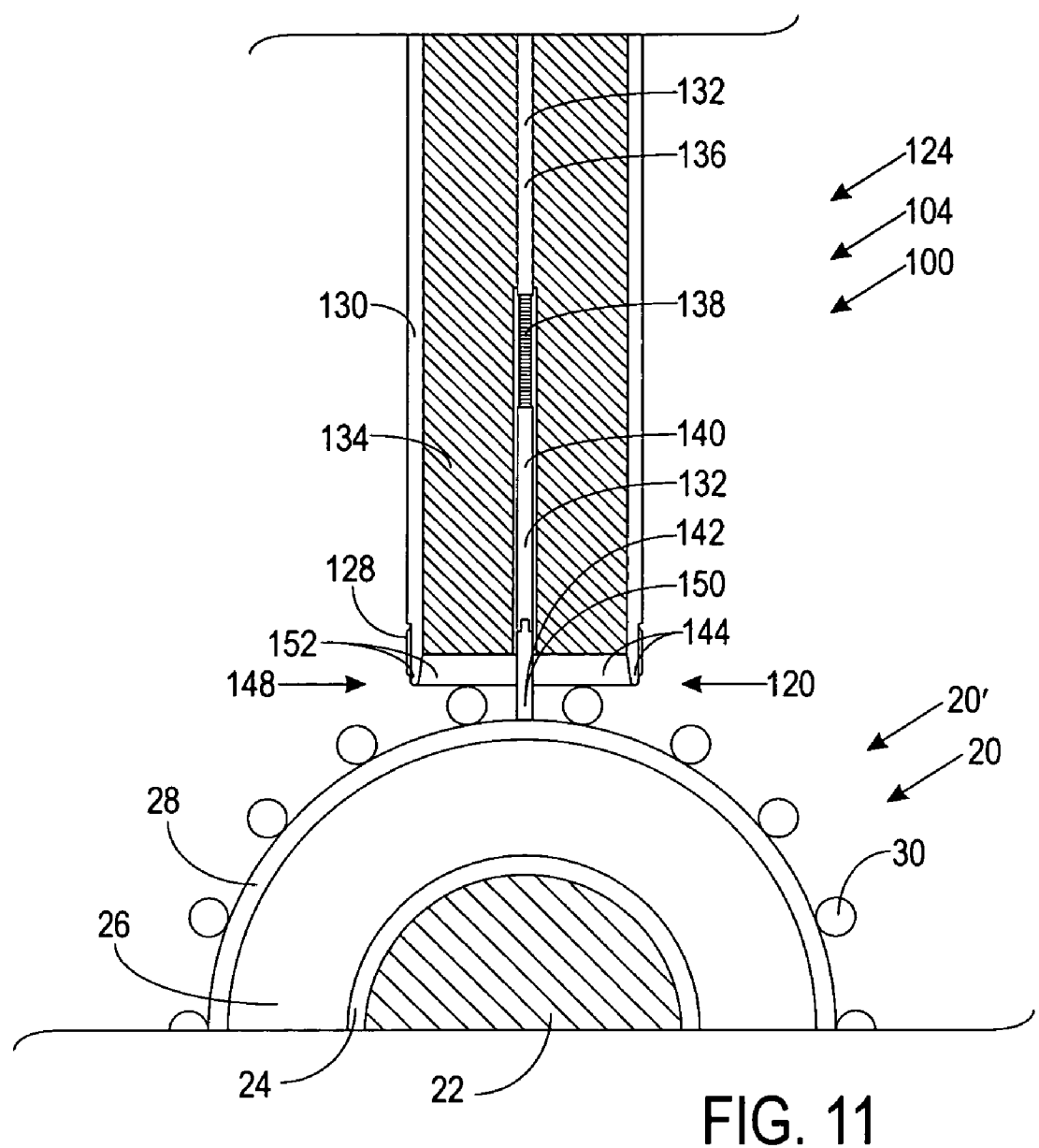
FIG. 11 shows a cross-sectional side view of the apparatus of FIGS. 3 and 4 in contact with an unjacketed URD cable in accordance with a preferred embodiment of the present invention.
Figure 12:
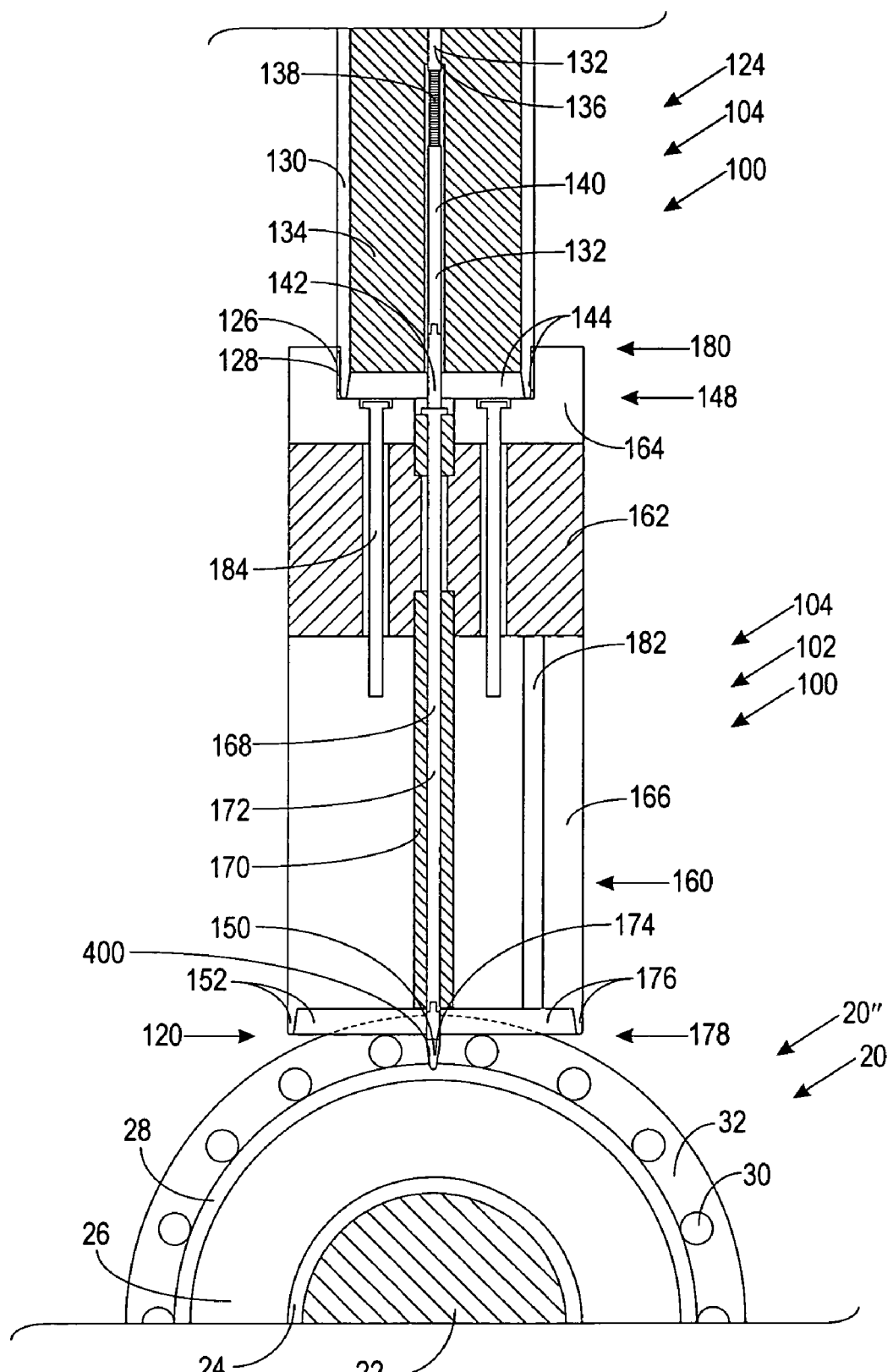
FIG. 12 shows a cross-sectional side view of the apparatus of FIGS. 3, 4, and 5 in contact with a jacketed URD cable in accordance with a preferred embodiment of the present invention.
Figure 13:
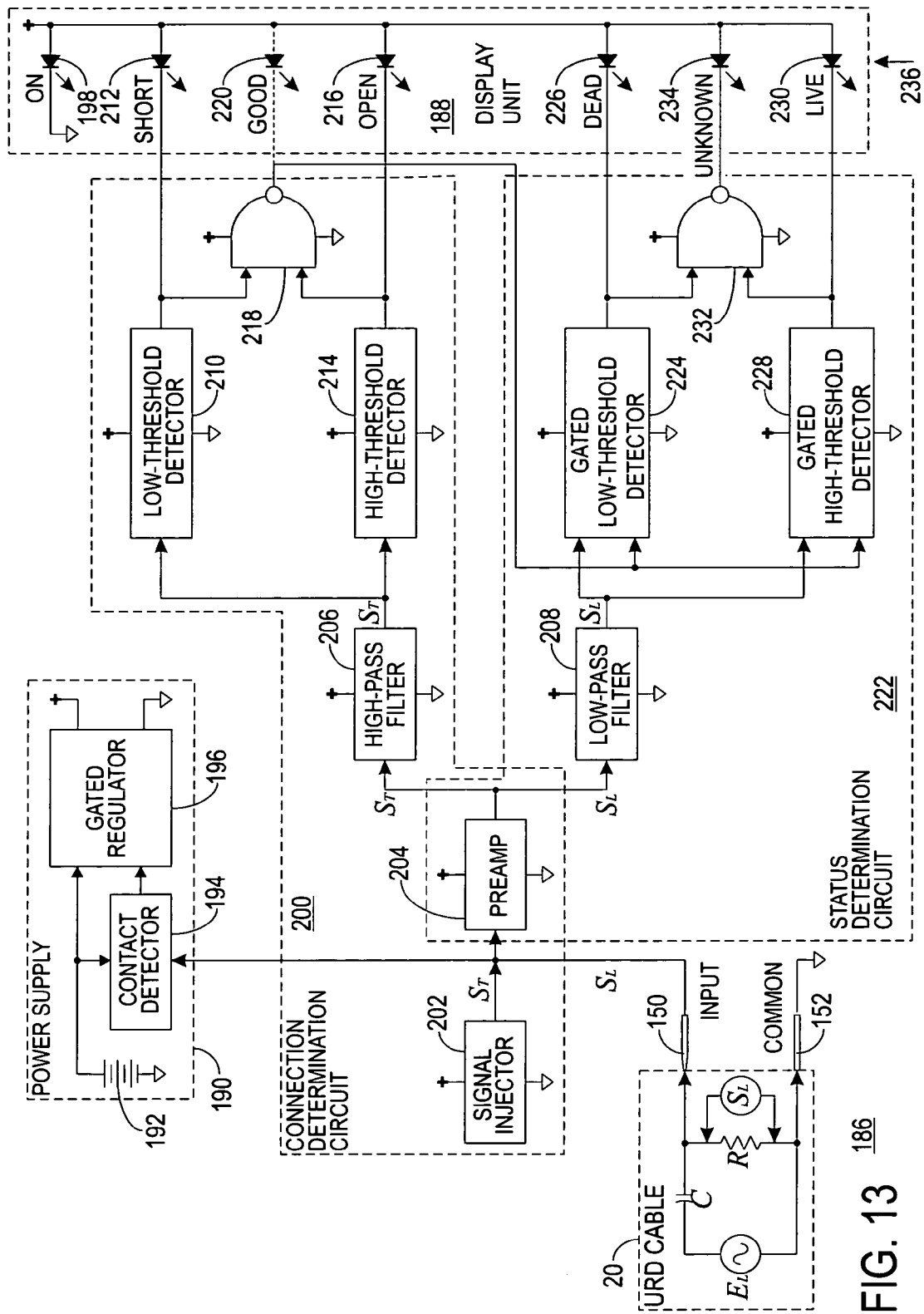
FIG. 13 shows a schematic block diagram of a cable analysis circuit for the apparatus of FIG. 3 in accordance with a preferred embodiment of the present invention.

FIG. 10 shows a flow chart of a method 300 for determining the status of URD cable 20 using apparatus 100 in accordance with a preferred embodiment of the present invention. FIGS. 11 and 12 show cross-sectional side views of apparatus 100 in contact with unjacketed URD cable 20' (FIG. 11) and jacketed URD cable 20" (FIG. 12) in accordance with a preferred embodiment of the present invention. FIG. 13 shows a schematic block diagram of a cable analysis circuit 186 for apparatus 100 in accordance with a preferred embodiment of the present invention. FIGS. 14 through 19 show a plan view of a status display unit 188 for apparatus 100 depicting no electrical connection (FIG. 14), a "short" or low-resistance electrical connection (FIG. 15), an "open" or high-resistance electrical connection (FIG. 16), a "dead" or de-energized cable status (FIG. 17), an "unknown" or indeterminate cable status (FIG. 18), and a "live" or energized cable status (FIG. 19) in accordance with a preferred embodiment of the present invention. The following discussion refers to FIGS. 3 and 10 through 13.

Initially, a task 302 (FIG. 10) determines, typically through observation by a worker, if URD cable 20 to be tested is unjacketed URD cable 20' (FIG. 11) or jacketed URD cable 20" (FIG. 12).

If task 302 determines URD cable 20 is unjacketed URD cable 20', then, if melt unit 102 is attached to probe body 124, a task 304' detaches melt unit 102 from probe body 124.

Next, an optional task 306' cleans unjacketed URD cable 20'. Desirably, task 306' cleans unjacketed URD cable 20' through the use of a hotstick with a cleaning device attached (not shown). In this manner, the worker stays safely away from unjacketed URD cable 20'. Task 306' is considered optional because it may be skipped, particularly on the first attempt at determining cable status. A worker may decide to skip task 306' if an observation of cable 20' reveals neutral conductors that do not appear to be particularly corroded. But if cable status cannot be successfully determined on the first attempt, then subsequent iterations may include task 306'.

A task 308' then positions active end 120 of probe 104 over a desired contact location on unjacketed URD cable 20'.

A task 310' connects probe 104 to unjacketed URD cable 20' by causing input contact 150 to contact outer semiconductor sheath 28 and common contact 152 to contact at least one of neutral conductors 30. Common contact 152 acts as a blocking member that blocks further penetration of input contact 150 into cable 20'. The tip of probe-body input contact 142 (serving as probe input contact 150) is substantially flat or blunt to provide a significant amount of contact area and to minimize damage to outer semiconductor sheath 28.

A task 314' then determines if probe 104 has successfully established an electrical connection with unjacketed URD cable 20' in task 310'. That is, task 314' determines that input contact 150 contacts either outer semiconductor sheath 28 or one of neutral conductors 30 at the same time common contact 152 contacts one of neutral conductors 30. The establishment of the electrical connection is evidenced by the illumination of an "on" indicator 198 (FIGS. 13 and 15 through 19).

It will be appreciated that input contact 150 may on occasion contact one of neutral conductors 30. This constitutes a "short" electrical connection, and is discussed in detail hereinafter.

Similarly, it will be appreciated that input contact 150 may on occasion not effect a good contact with outer semiconductor sheath 28. This constitutes an "open" electrical connection, and is discussed in detail hereinafter.

Apparatus 100 incorporates cable analysis circuit 186 (FIG. 13) housed within instrumentation unit 106 (FIG. 3)

and electrically coupled to input and common contacts 150 and 152. Cable analysis circuit 186 includes a power supply 190 configured to automatically provide power to the remainder of cable analysis circuit 186 when task 310' establishes the electrical connection between probe 104 and URD cable 20.

Power supply 190 contains a battery 192, a contact detector 194 coupled between battery 192 and input contact 150, and a gated regulator 196. URD cable 20 has cable resistance R between the point on outer semiconductor sheath 28 where input contact 150 makes contact and the neutral conductor 30 where common contact 152 makes contact. Therefore, when a electrical connection has been made, there is a complete circuit through battery 192, contact detector 194, input contact 150, cable resistance R, common contact 152, and back to battery 192. When this complete circuit occurs, current flows though contact detector 194, and a signal is sent to gated regulator 196. Gated regulator 196 then turns on and supplies regulated power to the remainder of cable analysis circuit 186. This results in an "on" indicator 198 of status display unit 188 being activated (FIGS. 13 and 15 through 19). This auto-on feature simplifies and thereby encourages the use of apparatus 100, and also prevents accidentally leaving apparatus 100 turned on and unnecessarily draining battery 192.

In addition, battery 192 is preferably tested prior to the use of apparatus 100 to prevent errors. The auto-on feature allows battery 192 to be tested by simply shorting input and common contacts 150 and 152 together with a coin, a key, a tool, or any other handy piece of metal. A good battery 192 will result in a "short" indication (FIG. 15) of status display unit 188 (discussed in detail hereinafter).

Those skilled in the art will appreciate that other methods of turning on apparatus 100 may be incorporated. The use of any such method, including but not limited to a simple switch, does not depart from the spirit of the present invention.

If task 314' (FIG. 10) determines that probe 104 has not established the electrical connection, i.e., "on" indicator 198 is not lit, then the process flow passes back to task 308', and probe 104 is repositioned at a different contact location on unjacketed URD cable 20'. Tasks 308', 310', and 314' are repeated.

If task 314' determines that probe 104 has established the electrical connection. i.e., "on" indicator 198 is lit, then a task 316' then determines if the electrical connection is a "short" connection.

Cable analysis circuit 186 incorporates a connection determination circuit 200 (FIG. 13). Connection determination circuit 200 is a form of dynamic ohmmeter configured to compare cable resistance R against predetermined resistance thresholds. A signal injector 202 injects a trace signal $S_T$ into input contact 150. Trace signal $S_T$ is divided between an output resistance (not shown) of signal injector 202 and cable resistance R. Trace signal $S_T$ therefore has a trace-signal amplitude that is a function of the value of cable resistance R.

Signal injector 202 produces trace signal $S_T$ at a frequency different from the line frequency (usually 50 or 60 Hz) of the electric distribution system of which URD cable 20 is a part. This frequency is typically higher, and is nominally 32 kHz in the preferred embodiment. Those skilled in the art will appreciate that the use of other frequencies for trace signal $S_T$ does not depart from the spirit of the present invention.

Trace signal $S_T$ is amplified by a preamplifier 204 and passes to the inputs of a first filter 206 configured to pass trace signal $S_T$ and a second filter 208 configured to block trace signal $S_T$. In the preferred embodiment the pass filter 206 is a high-pass filter configured to pass signals at the trace frequency (32 kHz) and block signals at the line frequency (50–60 Hz), and the block filter 208 is a low-pass filter configured to block signals at the trace frequency and pass signals at the line frequency. Trace signal $S_T$ therefore passes through high-pass filter 206.

Trace signal $S_T$ is then applied to a pair of threshold detectors. A lower-threshold detector 210 determines if the trace-signal amplitude is less than a predetermined lower trace threshold. That is, since the trace-signal amplitude is a function of the cable resistance R, lower threshold detector 210 determines if cable resistance R is less than a predetermined lower resistance threshold. In the preferred embodiment, this predetermined lower resistance threshold is greater than 75 Ω, and preferably approximately 100 Ω.

A cable resistance R of less than the lower resistance threshold results in a "short" connection, and a "short" indicator 212 of status display unit 188 (FIGS. 13 and 15) is activated. Such a condition indicates that input contact 150 is contacting either one of neutral conductors 30 or is contacting a local shorted area of outer semiconductor sheath 28.

In either case, task 316' (FIG. 10) determines that the electrical connection is a "short" connection, i.e., the "short" indicator 212 is lit. The process flow passes back to task 308' and apparatus 100 is repositioned at a different contact location on unjacketed URD cable 20'. Tasks 308', 310', 314', and 316' are repeated.

If task 316' determines that the electrical connection is not a "short" connection, i.e., "short" indicator 212 is not lit, then a task 318' determines if the electrical connection is an "open" connection.

A higher-threshold detector 214 (FIG. 13) determines if the trace-signal amplitude is greater than a predetermined higher trace threshold. That is, if cable resistance R is greater than a predetermined higher resistance threshold. In the preferred embodiment, this predetermined higher resistance threshold is less than 50 kΩ, and preferably approximately 30 kΩ.

A cable resistance R of greater than the higher resistance threshold results in an "open" indicator 216 of status display unit 188 (FIGS. 13 and 16) being activated. Such a condition may indicate that input contact 150 is making a poor contact with outer semiconductor sheath 28, or is contacting a local contaminated area of outer semiconductor sheath 28, or that common contact 152 is making a poor contact with neutral conductors 30.

In any of these situations, task 318' (FIG. 10) determines that the electrical connection is an "open" connection, i.e., the "open" indicator 216 is lit. The process flow passes back to task 306', unjacketed URD cable is cleaned or re-cleaned, and apparatus 100 is optionally repositioned at a different contact location on unjacketed URD cable 20'. Tasks 308', 310', 314', 316', and 318' are repeated.

If task 318' determines that the electrical connection is not an "open" connection, i.e., "open" indicator 216 is not lit, then the electrical connection is a "good" connection, i.e., is a valid connection. The electrical connection can be a valid connection only when the electrical connection is neither a "short" nor an "open" connection, i.e., when neither "short" indicator 212 nor "open" indicator 216 is lit. This occurs when lower-threshold detector 210 determines the trace-signal amplitude is greater than the lower trace threshold and higher-threshold detector 214 determines the trace-signal amplitude is less than the higher trace threshold, i.e., cable resistance R is greater than the lower resistance threshold and less than the higher resistance threshold. In this condition a logic gate 218 causes an optional "good" indicator 220 of status display unit 188 (FIG. 13) being activated.

An output of logic gate 218 is used to provide condition information elsewhere in cable analysis circuit 186.

Cable analysis circuit 186 incorporates a status determination circuit 222. Status determination circuit 222 is a form of a gated comparator configured to compare line signal $S_L$ against predetermined signal thresholds. Line signal $S_L$ is amplified by preamplifier 204 and passes to the inputs of first filter 206 configured to block line signal $S_L$ and second filter 208 configured to pass line signal $S_L$. In the preferred embodiment the block filter 206 is a high-pass filter configured to block signals at the line frequency and pass signals at the trace frequency, and the pass filter 208 is a low-pass filter configured to block signals at the trace frequency and pass signals at the line frequency. Line signal $S_L$ therefore passes through the low-pass filter 208.

Line signal $S_L$ is then applied to a pair of gated threshold detectors. The gate of each of these gated threshold detectors is coupled to logic gate 218 of connection determination circuit 200. This means that each of the gated threshold detectors can produce an output only if connection determination circuit 200 determines that the electrical connection between probe 104 and URD cable 20 is a valid electrical connection, i.e., is a "good" connect wherein either optional "good" indicator 220 is lit and/or both "short" indicator 212 and "open" indicator 216 are not lit.

No determination of the status of URD cable 20 is made unless connection determination circuit 200 is simultaneously determining that the electrical connection between probe 104 and URD cable 20 is a valid electrical connection. This logic severely limits the potential for either a false-dead or a false-live status indication.

If task 318' (FIG. 10) determines that the electrical connection is not an "open" connection, i.e., "open" indicator 216 is not lit, then a task 320' determines if the status of unjacketed URD cable 20' is "dead" or de-energized.

A gated lower-threshold detector 224 determines if the line-signal amplitude is less than a predetermined lower signal threshold. A line-signal amplitude less than the lower signal threshold results in a "dead" indicator 226 of status display unit 188 (FIGS. 13 and 17) being activated. Such a condition indicates that URD cable 20 is dead, i.e., de-energized.

This constitutes a positive test for a "dead" status for URD cable 20. Such a positive dead test, where a de-energized URD cable 20 is positively determined to be dead, is superior to a negative live test, where a de-energized URD cable 20 is determined to be not live. A positive dead test eliminates many possible false-dead indications (where a live URD cable 20 is falsely reported to be dead), whereas a negative live test does not. A false-dead status is the worst of all possible indications and creates the potential for injury or death should the worker spike or cut a live URD cable 20.

Figure 17:
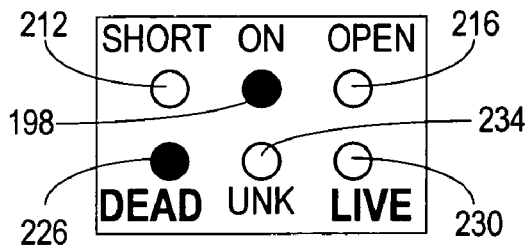
FIG. 17 shows a plan view of the status display panel of FIG. 14 depicting a "dead" or de-energized URD cable status in accordance with a preferred embodiment of the present invention.
Figure 15:
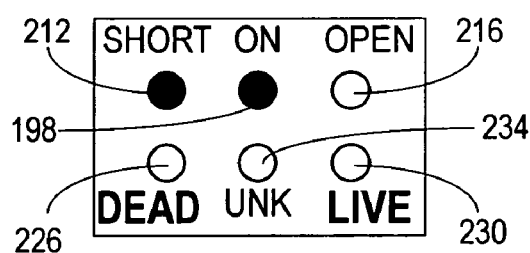
FIG. 15 shows a plan view of the status display panel of FIG. 14 depicting a "short" or low-resistance electrical connection in accordance with a preferred embodiment of the present invention.
Figure 18:
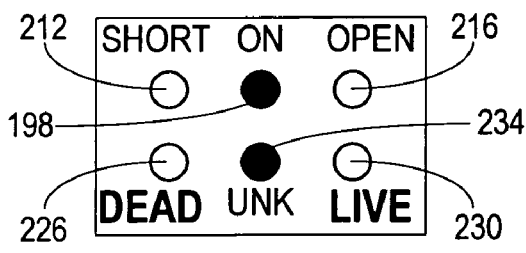
FIG. 18 shows a plan view of the status display panel of FIG. 14 depicting an "unknown" or indeterminate URD cable status in accordance with a preferred embodiment of the present invention.
Figure 16:
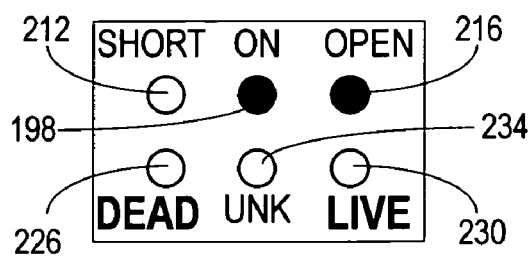
FIG. 16 shows a plan view of the status display panel of FIG. 14 depicting an "open" or high-resistance electrical connection in accordance with a preferred embodiment of the present invention.

If task 320' (FIG. 10) determines that the status of unjacketed URD cable 20' is "dead" or de-energized, then flow routes to a terminal task 322 wherein unjacketed URD cable 20' is indicated to be dead, i.e. "dead" indicator 226 is lit (FIGS. 13 and 17).

If task 320' determines that the status of unjacketed URD cable 20' is not "dead" or de-energized, i.e., "dead" indicator is not lit, then a task 324' determines if the status of unjacketed URD cable 20' is "live" or energized.

A gated higher-threshold detector 228 (FIG. 13) determines if the line-signal amplitude is greater than a predetermined higher signal threshold. A line-signal amplitude greater than the higher signal threshold results in a "live" indicator 230 of status display unit 188 (FIGS. 13 and 19) being activated. Such a condition indicates that URD cable 20 is live, i.e., energized.

This constitutes a positive test for a "live" status for URD cable 20. A positive live test, where an energized URD cable 20 is positively determined to be live, eliminates many possible false-live indications (where a dead URD cable 20 is falsely reported to be live).

If task 324' (FIG. 10) determines that the status of unjacketed URD cable 20' is "live" or energized, then an optional task 326' determines, usually by observation, if unjacketed URD cable 20' is clamped.

Under certain conditions, a dead unjacketed URD cable will pick up enough electrical noise, perhaps in the form of stray ground currents flowing in neutral conductors 30, to produce a false-live or unknown status indication. This can occur when neutral conductors 30 loosely contact outer semiconductor sheath 28, or when sufficient corrosion of neutral conductors 30 has set in so as to cause a poor contact between neutral conductors 30 and outer semiconductor sheath 28 at the contact location. This condition may be improved by clamping neutral conductors 30 to outer semiconductor sheath 28 to break through the corrosion and otherwise short any stray ground currents to semiconductor sheath 28.

The preferred method of clamping is to use one or two hotsticks with one or two "hotstick clamps" affixed to the ends of hotsticks. In this manner, the worker stays safely away from unjacketed URD cable 20'. If one clamp is used, it is desirably positioned as close to the probing area as possible. More preferably, two clamps are used, and the two clamps are positioned roughly 30 cm apart, on opposing sides of the probing area. The clamps shunt or short circuit any stray current flow down the outside of semiconductor sheath 28 around the area being probed. Thus, any voltage measured in the probed area between the clamps originates from current flow at the center conductor 22, via capacitance "C" (FIGS. 8–9), to semiconductor sheath 28, and then to neutral conductors 30. But if the cable is live, the clamps do not interfere with the measurement.

If task 326' determines that unjacketed URD cable 20' is not clamped or that it may be inadequately clamped, then in a task 328' unjacketed URD cable is clamped or re-clamped as discussed above. Flow then passes to task 308', where probe 104 is repositioned at a contact location on unjacketed URD cable 20' proximate the clamp or clamps. Tasks 308', 310' 314', 316' 318, 320, 324', and 326' are repeated.

Figure 19:
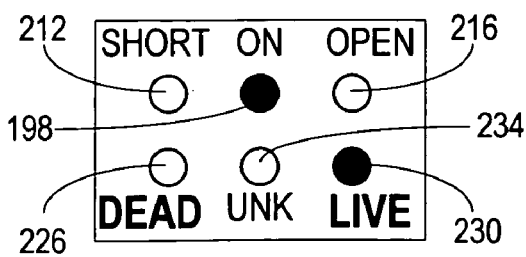
FIG. 19 shows a plan view of the status display panel of FIG. 14 displaying a "live" or energized URD cable status in accordance with a preferred embodiment of the present invention.

If task 326' determines that unjacketed URD cable 20' is adequately clamped and indicating a live condition, then process flow routes to a terminal task 330, wherein unjacketed URD cable 20' is simply indicated as being live, i.e. "live" indicator 230 is lit (FIGS. 13 and 19).

If task 324' determines that the status of unjacketed URD cable 20' is not "live" or energized, i.e., "live" indicator 230 is not lit, then in a task 332' the status of unjacketed URD cable 20' cannot be determined, i.e., is "unknown" or indeterminate.

When gated lower-threshold detector 224 determines the line-signal amplitude is greater than the lower signal threshold and gated higher-threshold detector 228 determines the line-signal amplitude is less than the higher signal threshold, then a logic gate 232 results in an "unknown" indicator 234 of status display unit 188 (FIGS. 13 and 18) being activated. Such a condition indicates that the status of URD cable 20 is indeterminate. In this case, the process flow passes back to tasks 326' and 328' where unjacketed URD cable 20' is clamped or re-clamped as discussed above. Tasks 308', 310' 314', 316' 318', 320', 324', and 326' are then repeated. Presumably, a worker will repeat the above-discussed tasks as needed until a clear indication of either a "dead" or "live" cable is obtained.

If task 302 determines URD cable 20 is jacketed URD cable 20", then, if melt unit 102 is not attached to probe body 124, a task 304" attaches melt unit 102 to probe body 124.

A task 306" heats melt unit 102 to the desired temperature by applying heat from external heat source 181.

A task 308" positions active end 120 of probe 104 over a desired contact location on jacketed URD cable 20".

A task 310" connects probe 104 to jacketed URD cable 20" by causing input and common contacts 150 and 152 to melt through insulating jacket 32 of jacketed URD cable 20" so that input contact 150 contacts outer semiconductor sheath 28 and common contact 152 contacts at least one of neutral conductors 30. The tip of melt-unit input contact 174 (serving as probe input contact 150) is a blunt point, but sharper than probe-body input contact 142, to allow melting through jacket 32 and a partial melt into the outermost portion of outer semiconductor sheath 28. Probe 104 is pressed against jacketed URD cable 20" until the lip or rim of common contact 176 contacts one or two neutral conductors 30. Due to the projection of input contact 174 a predetermined distance beyond contact 176, input contact 174 will only slightly penetrate into semiconductor sheath 28 when contact 176 abuts neutral conductors 30. Common contact 152 acts as a blocking member that blocks further penetration of input contact 150 into cable 20". With contact 176 projecting around 2.5 mm beyond common contact 174, sufficient, but not excessive, penetration into semiconductor sheath 28 results when cable 20" has 10–14 gage neutral conductors 30. When larger or smaller diameter neutral conductors 30 are encountered, then input contact 174 is replaced by a longer or shorter input contact 174, as needed.

A task 312" determines, typically through observation, if task 310" successfully melted melt unit 102 into insulating jacket 32, i.e., if melt unit 102 was hot enough.

If task 312" determines that melt unit 102 was not hot enough (i.e., there was a bad melt), then the process flow passes back to task 306" and melt unit 102 is reheated. Tasks 306", 308", 310", and 312" are repeated.

A task 314" then determines if probe 104 has successfully established an electrical connection with jacketed URD cable 20" in task 310" as discussed hereinbefore for task 314'.

If task 314" determines that probe 104 has not established the electrical connection, i.e., "on" indicator 198 is not lit, then the process flow passes back to task 308" and probe 104 is repositioned at a different contact location on jacketed URD cable 20". Tasks 308", 310", 312", and 314" are repeated.

If task 314" determines that probe 104 has established the electrical connection. i.e., "on" indicator 198 is lit, then a task 316" determines if the electrical connection is a "short" connection as discussed hereinbefore in connection with task 316'.

If task 316" determines that the electrical connection is a "short" connection, i.e., the "short" indicator 212 is lit, then the process flow passes back to task 308' and apparatus 100 is repositioned at a different contact location on jacketed URD cable 20". Tasks 308", 310", 312", 314", and 316" are repeated.

If task 316" determines that the electrical connection is not a "short" connection, i.e., "short" indicator 212 is not lit, then a task 318" determines if the electrical connection is an "open" connection as discussed hereinbefore in connection with task 318'.

If task 318" determines that the electrical connection is an "open" connection, i.e., the "open" indicator 216 is lit, then the process flow passes back to task 308" and apparatus 100 is repositioned to a different contact location on jacketed URD cable 20". Tasks 308", 310", 312", 314", 316", and 318" are repeated.

If task 318" determines that the electrical connection is a "good" or valid connection, then a task 320" determines if the status of jacketed URD cable 20" is "dead" or de-energized as discussed hereinbefore in connection with task 320'.

If task 320" determines that the status of jacketed URD cable 20" is "dead", then flow routes to terminal task 322 wherein jacketed URD cable 20" is indicated to be dead, i.e. "dead" indicator 226 is lit.

If task 320" determines that the status of jacketed URD cable 20" is not "dead" or de-energized, i.e., "dead" indicator is not lit, then a task 324" determines if the status of jacketed URD cable 20" is "live" or energized as discussed hereinbefore in connection with task 324'.

If task 324" (FIG. 10) determines that the status of jacketed URD cable 20" is "live" or energized, then flow routes to a terminal task 330 wherein jacketed URD cable 20" is indicated to be live, i.e. "live" indicator 230 is lit.

If task 324" determines that the status of jacketed URD cable 20" is not "live" or energized, i.e., "live" indicator 230 is not lit, then in a task 332" the status of jacketed URD cable 20" cannot be determined, i.e., is "unknown" or indeterminate as discussed hereinbefore. In this case, the process flow passes back to task 308" and apparatus 100 is repositioned to another contact location on jacketed URD cable 20". Tasks 308", 310", 312", 314", 316", 318", 320", and 324" are repeated.

Terminal tasks 322 and 330, for "dead" and "live" statuses respectively, represent the end or termination of a successful status determination effort. However, even though apparatus 100 is carefully structured to minimized the possibility of either a false-dead or a false-live status indication, there is always a chance that such an error might occur. The presence of such an error, especially a false-dead indication, may pose a hazard and incur a risk of injury or death. To further reduce any chance of injury or death, terminal tasks 322 and 330 should be followed by a task 334 wherein the entire status determination method 300 is repeated with apparatus 100 positioned at a different contact location on URD cable 20. After a plurality of such status determination procedures, the assurance that URD cable 20 is truly dead or live approaches certainty. The ease with which apparatus 100 may be used to perform status determination method 300 encourages repeated performances of method 300.

The following discussion refers to FIGS. 3 and 13 through 19.

Status display unit 188 contains a plurality of indicators 236 coupled to display side 118 of instrumentation unit 106.

By using a plurality of indicators 236, sufficient information is imparted to the worker to make an informed and safe decision regarding the status of URD cable 20. In the preferred embodiment, indicators 236 include "on" indicator 198 to indicate an electrical connection is established between probe 104 and URD cable 20, "short" indicator 212 to indicate that the electrical connection is a "short" connection and not a valid connection, "open" indicator 216 to indicate that the electrical connection is an "open" connection and not a valid connection, "dead" indicator 226 to indicate that URD cable 20 is de-energized when the electrical connection is a valid connection, "live" indicator 230 to indicate that URD cable 20 is energized when the electrical connection is a valid connection, and "unknown" indicator 234 to indicate that the status of URD cable 20 cannot be determined. In an alternative embodiment, "good" indicator may be used in conjunction with or in lieu of "short" and "open" indicators 212 and 216 to indicate that the electrical connection is a valid connection.

Indicators 236 are placed on display side 118 of instrumentation unit 106 so as to be in the worker's line of sight while the worker is establishing contact with and determining the status of URD cable 20. In the preferred embodiment, indicators 236 are visual indicators, preferably light-emitting diodes.

In the preferred embodiment, indicators 236 are patterned in two rows or lines. A first line of indicators 236 contains "short" indicator 212, "on" indicator 198, and "open" indicator 216, i.e., those indicators 236 associated with condition determination circuit 200. A second line of indicators 236 contains "dead" indicator as 226, "unknown" indicator 234, and "live" indicator 230.

In the preferred embodiment, "dead" indicator 226 is of a first color, preferably green, "live" indicator is of a second color different from the first color, preferably red, and the remaining indicators 236 are of a third color different from either the first or second colors, preferably yellow. By using this color scheme, instantaneous and distinct interpretation of the indicated status of URD cable 20 by the worker is possible.

In addition, "short" indicator 212, "open" indicator 216, and "unknown" indicator 234 are oriented relative to "on" indicator 198 so that again instantaneous and distinct interpretation by the worker is possible.

On some URD cables the condition of semiconductor sheath 28 prevents detecting line signal $S_L$ (FIGS. 8 and 9). On these cables, line signal $S_L$ is too small to be reliably detected even when URD cable 20 is energized. To overcome this problem, probe input contact 150 may be insulated and used to penetrate through semiconductor sheath 28 to directly sense the electric field of central conductor 22. Semiconductor sheath 28 is desirably penetrated because it shields the electric field from central conductor 22. Using this technique, capacitor "C" represents the capacitance between central conductor 22 and probe input contact 150. Since probe input contact 150 is insulated, resistor "R" is infinite and does not load down or attenuate small line signal $S_L$ capacitive coupled from central conductor 22 to probe input contact 150.

Figure 20:
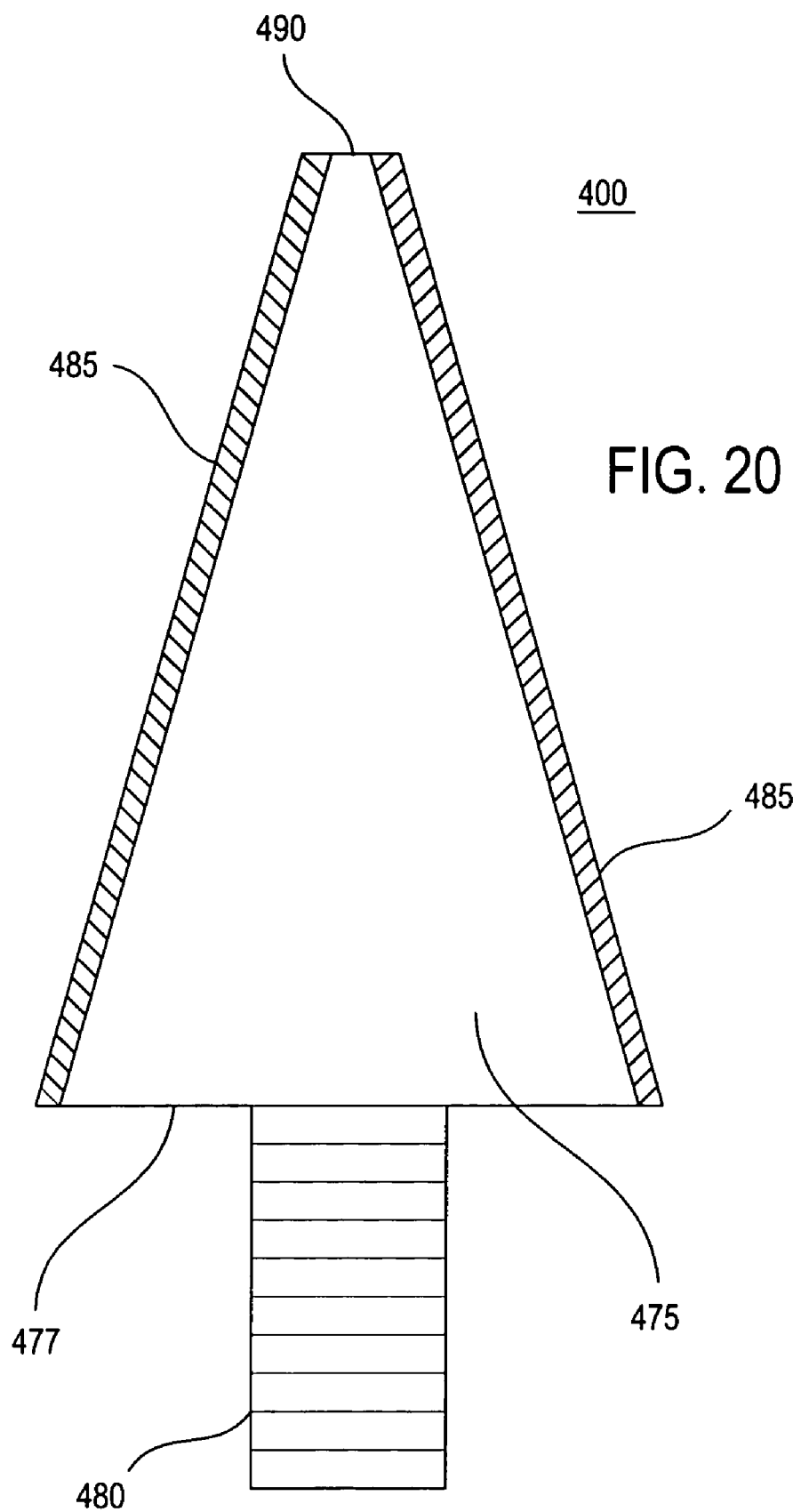
FIG. 20 shows a cross-sectional side view of a detachable insulated input contact whose blunt end is not insulated in accordance with a preferred embodiment of the present invention.

In this preferred embodiment, a slightly longer (approximately 0.025") insulated input contact 400 (FIG. 20) is used in place of the non-insulated detachably coupled input contact 174 (FIG. 12) discussed above. A contact shank 475 portion of input contact 400 is coated with a high temperature insulating material 485 such as paint, epoxy, or ceramic. The blunt contact tip 490 of input contact 400 is not coated nor are the threads 480 or the flat seating surface 477 where insulated input contact 400 couples to fixed conductor portion 172.

Contact tip 490 of insulated input contact 400 is not insulated so as to indicate to the operator that semiconductor sheath 28 has been penetrated. When using insulated input contact 400, the operator will watch indicators 236 and observe a "good" resistance as semiconductor sheath 28 is being penetrated. This resistance will rise to an "open" resistance when the non-insulated contact tip 490 fully penetrates semiconductor sheath 28 because contact shank 475 is insulated from contact with semiconductor sheath 28 everywhere except on contact tip 490. This change of state by indicators 236 assures the operator that if "dead" indicator 226 is lit, this absence of an electric field measurement correctly indicates a non-energized cable. Had semiconductor sheath 28 not been fully penetrated, no electric field voltage would have been sensed, even on an energized cable, due to the shielding effect of semiconductor sheath 28.

In one preferred embodiment, an operator mode selection switch (not shown) may be provided to switch the input connection of gated low-threshold detector 224 and gated high-threshold detector 228 from the output of ' logic gate 218 to the output of high-threshold detector 214 (FIG. 13). This changes the output of connection determination circuit 200 from "good" to "open" when insulated input contact 400 is selected. That is, each of the gated threshold detectors 224 and 228 can produce an output only if connection determination circuit 200 determines that the electrical connection between probe 104 and URD cable 20 is a valid electrical connection, i.e., is an "open" connect wherein the "open" indicator 216 is lit.

Heat melt unit 102 with insulated input contact 400 can also be used on unjacketed URD cable 20' (FIG. 1) in addition to jacketed URD cable 20" (FIG. 2). So doing allows the energized status to be determined on unjacketed URD cables whose semiconductor sheath 28 is corroded or deteriorated.

Figure 21:
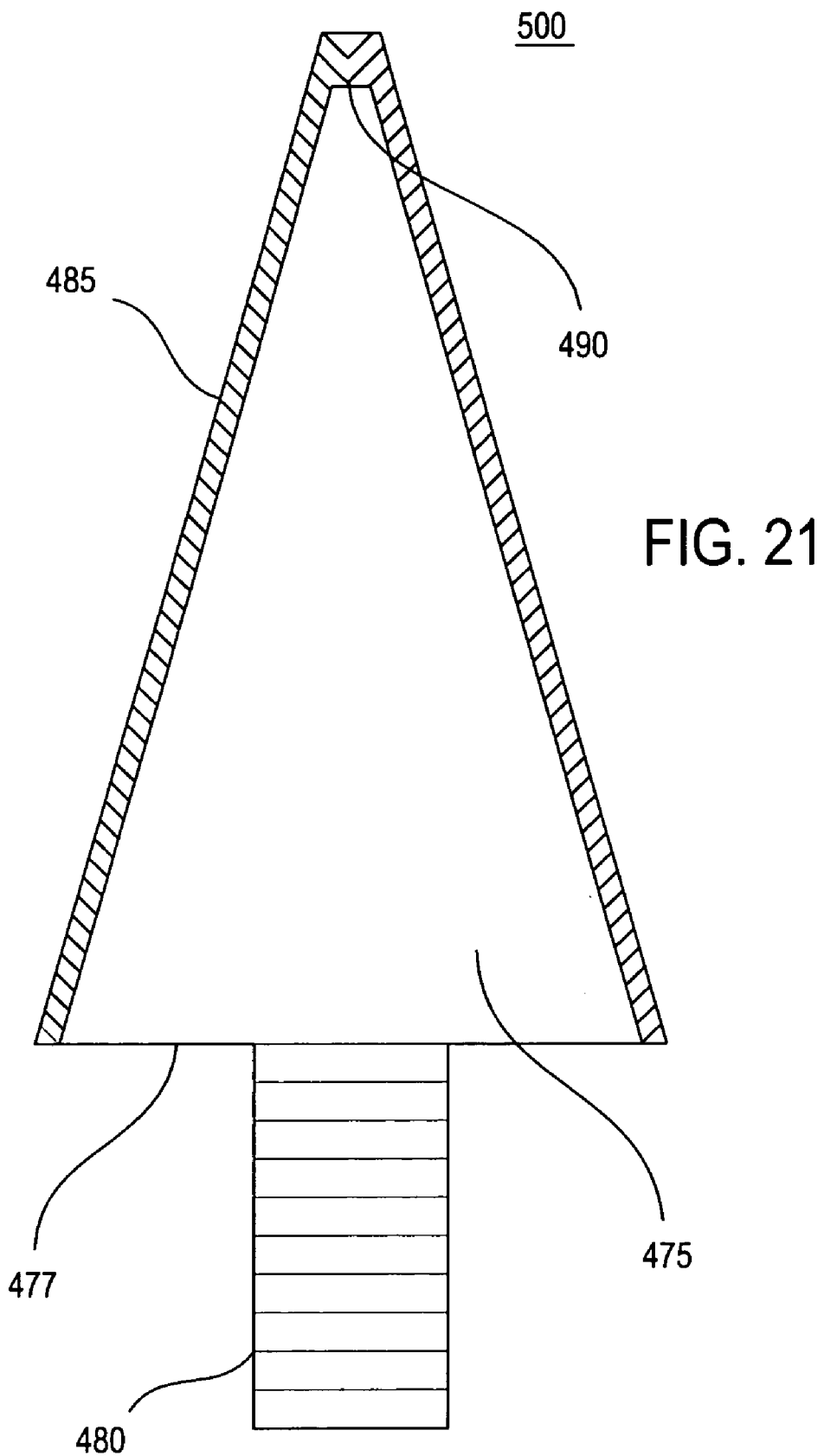
FIG. 21 shows a cross-sectional side view of a detachable insulated input contact whose blunt end is insulated in accordance with a preferred embodiment of the present invention.

In another embodiment 500 (FIG. 21), the length of insulated input contact 400 is increased by approximately 0.050" and contact tip 490 is insulated. In this embodiment, "open" indicator 216 is always lit because no contact can be made between insulated input contact 500 and semiconductor sheath 28. If "open" indicator 216 extinguishes during penetration, it indicates that insulation 485 has failed and insulated input contact 500 must be replaced.

The operator initially holds the power-cable status determination apparatus 100 so that probe 104 and melt unit 102 is at an approximately 30 degree oblique angle to the URD cable 20" to limit the depth to which this longer insulated input contact 500 penetrates the cable (FIG. 22). While watching "live" indicator 230, the operator slowly raises the apparatus 100 towards perpendicular to the URD cable 20" along path 602 to increase the penetration depth of the longer insulated input contact 500. If "live" indicator 230 lights, it indicates that the longer insulated input contact 500 has penetrated the semiconductor sheath 28, the cable is energized, and further penetration should be suspended by not raising apparatus 100 any more towards perpendicular. If "live" indicator 230 does not light, it indicates the cable is not energized. Raising apparatus 100 all the way to perpendicular (FIG. 23) ensures that semiconductor sheath 28 has been fully penetrated by the longer insulated input contact 500.

In yet another embodiment, input contact 142 (FIG. 11) is a totally insulated sharp needle (not shown), similar to those used in sewing, and movable conductor portion 140 is rigid inside probe body 124. Heat melt unit 102 need not be used. Instead, the insulated sharp needle may be pressed through semiconductor sheath 28 of either unjacketed URD cable 20' or jacketed URD cable 20" using brute force. Alternatively, input contact 142 could be fashioned as an insulated wood or sheet metal screw (not shown) and apparatus 100 twisted (turned) to screw this form of input contact 142 through semiconductor sheath 28. Instead of implementing these insulated sharp needle or insulated screw embodiments inside probe body 124, they could also be implemented inside a separate adapter (not shown) that is attached to probe body 124 as is heat melt unit 102.

In all these embodiments using an insulated probe input contact 150, the fundamental measurement technique is the same. Specifically, the input contact is passed through semiconductor sheath 28 so as to sense the electric field of central conductor 22 directly. Semiconductor sheath 28 is desirably penetrated because it shields the electric field. Probe input contact 150 is desirably insulated because the low resistance of semiconductor sheath 28 can severely attenuate the small line signal $S_L$ capacitive coupled from central conductor 22 to probe input contact 150.

In summary, the present invention teaches an apparatus 100 for determining the status of an underground residential distribution (URD) cable 20. Apparatus 100 actively determines status for both a live and a dead URD cable 20. Apparatus 100 determines status for both unjacketed and jacketed URD cables 20' and 20". Apparatus 100 displays results viewable and instantly interpretable at a distance. Apparatus 100 determines a quality of connection to URD cable 20 while determining the status thereof.

Although the preferred embodiments of the invention have been illustrated and described in detail, it will be readily apparent to those skilled in the art that various modifications may be made therein without departing from the spirit of the invention or from the scope of the appended claims.

What is claimed is:

1. An apparatus for determining a status of an underground residential distribution (URD) cable in an electric power network, said apparatus comprising:
    a rigid probe configured to establish an electrical connection with said URD cable and comprising:
    a blocking member configured to penetrate said URD cable no further than a neutral conductor of said URD cable; and an input contact extending beyond said first blocking member and configured to penetrate said URD cable further than said neutral conductor of said URD cable;
    a cable analysis circuit electrically coupled to said blocking member and said input contact; and
    a status display unit electrically coupled to said cable analysis circuit.

2. An apparatus as claimed in claim 1 wherein said blocking member is a substantially rigid shell, and said input contact is substantially coaxial with said shell.

3. An apparatus as claimed in claim 2 wherein said rigid shell is a common electrical contact configured to electrically couple to said neutral conductor of said URD cable.

4. An apparatus as claimed in claim 1 wherein:
    said URD cable comprises:
        a plurality of spiral-wound wires at least one of which serves as said neutral conductor;
        an outer semiconductor sheath within said neutral conductor;
        an insulating layer within said outer semiconductor sheath;
        an inner semiconductor sheath within said insulating layer; and
        a center conductor within said inner semiconductor sheath;
    said input contact comprises:
        a contact shank having an insulated outer surface and configured to penetrate through and remain insulated from said outer semiconductor sheath; and
        a contact tip configured to penetrate through said outer semiconductor sheath and to enter said insulating layer.

5. An apparatus as claimed in claim 4 wherein said contact tip is a blunt point.

6. An apparatus as claimed in claim 4 wherein said contact tip is insulated.

7. An apparatus as claimed in claim 1 additionally comprising a melt unit thermally coupled to said input contact.

8. An apparatus as claimed in claim 7 wherein said melt unit is configured to be heated by an application of heat from an external heat source.

9. An apparatus as claimed in claim 1 wherein:
    said blocking member is a common contact that, contacts said neutral conductor of said URD cable;
    said input contact penetrates an outer semiconductor sheath of said URD cable; and
    said cable analysis circuit determines if an electric field is present within said URD cable.

10. An apparatus as claimed in claim 1 additionally comprising:
    an insulated shank coupled to one of said probe and said instrumentation unit; and
    a hotstick adapter coupled to said insulated shank.

11. An apparatus as claimed in claim 1 wherein:
    said rigid probe has an active end and an instrumentation end in opposition to said active end, wherein said input contact and blocking member are proximate said active end;
    said instrumentation unit has a probe side and a display side in opposition to said probe side, wherein said probe side is coupled to said probe proximate said instrumentation end; and
    said status display unit is coupled to said display side.

12. A method for determining a status of an underground residential distribution (URD) cable in an electric power network, said method comprising:
    contacting an outer semiconductor sheath of said URD cable with an input contact of a probe;
    penetrating said input contact of said probe into said outer semiconductor sheath;
    contacting a neutral conductor of said URD cable with a blocking member of said probe;
    monitoring an electrical signal detected at said input contact of said probe; and
    establishing said status of said URD cable in response to said monitoring activity.

13. A method as claimed in claim 12 wherein:
    said URD is a jacketed cable; and
    said neutral-conductor-contacting activity comprises melting through an insulating jacket of said URD cable with said blocking member to effect contact with said neutral conductor.

14. A method as claimed in claim 12 wherein said blocking member is a common contact which electrically couples to said neutral conductor when said blocking member contacts said neutral conductor.

15. A method as claimed in claim 12 wherein said penetrating activity is initially performed with said probe at an oblique angle to said URD cable until said blocking member contacts said neutral conductor, then said penetrating activity continues by moving said probe so that said probe is more nearly perpendicular to said URD cable.

16. A method as claimed in claim 12 wherein said penetrating activity causes said input contact to penetrate through said outer semiconductor sheath and into an insulating layer within said outer semiconductor sheath of said URD cable.

17. A method as claimed in claim 16 wherein said penetrating activity melts said outer semiconductor sheath.

18. A method as claimed in claim 16 additionally comprising insulating said input contact from said outer semiconductor sheath.

19. An apparatus for determining a status of an underground residential distribution (URD) cable in an electric power network, said apparatus comprising:
   a rigid coaxial probe configured to establish an electrical connection with said URD cable and comprising:
   a melt unit;
   a common contact configured to contact a neutral conductor of said URD cable; and
   an input contact thermally coupled to said melt unit and comprising:
   a contact shank having an insulated outer surface configured to penetrate an outer semiconductor sheath of said URD cable; and
   a blunt contact tip configured to pass through said outer semiconductor sheath and reside within an insulating layer between said outer semiconductor sheath and an inner semiconductor sheath of said URD cable;
   a cable analysis circuit electrically coupled to said common and said input contact; and
   a status display unit electrically coupled to said cable analysis circuit.

* * * * *